(12) United States Patent
Ausschnitt

(10) Patent No.: US 8,874,249 B2
(45) Date of Patent: Oct. 28, 2014

(54) DISCRETE SAMPLING BASED NONLINEAR CONTROL SYSTEM

(71) Applicant: International Business Machines Corporation, Armonk, NY (US)

(72) Inventor: Christopher P. Ausschnitt, Naples, FL (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/079,132

(22) Filed: Nov. 13, 2013

(65) Prior Publication Data

US 2014/0065733 A1      Mar. 6, 2014

Related U.S. Application Data

(63) Continuation of application No. 13/012,179, filed on Jan. 24, 2011, now Pat. No. 8,626,328.

(51) Int. Cl.
*G06F 19/00* (2011.01)
*G03F 7/20* (2006.01)
*G05B 13/02* (2006.01)
*H01L 21/66* (2006.01)

(52) U.S. Cl.
CPC .............. *H01L 22/26* (2013.01); *G03F 7/705* (2013.01); *G05B 13/02* (2013.01)
USPC ............. 700/108; 700/105; 700/121; 428/14

(58) Field of Classification Search
CPC ............................... G05B 13/02; H01L 22/26
USPC .......................................... 700/105, 108, 121
See application file for complete search history.

(56) References Cited

U.S. PATENT DOCUMENTS

| | | | |
|---|---|---|---|
| 6,419,846 B1 * | 7/2002 | Toprac et al. | 216/60 |
| 6,564,114 B1 * | 5/2003 | Toprac et al. | 700/121 |
| 6,869,739 B1 | 3/2005 | Ausschnitt et al. | |
| 7,439,001 B2 | 10/2008 | Ausschnitt et al. | |
| 7,556,899 B2 | 7/2009 | Ikeda et al. | |
| 7,571,420 B2 | 8/2009 | Wong et al. | |

(Continued)

OTHER PUBLICATIONS

"Bayesian Neural Networks for Nonlinear Multivariate Manufacturing Process Monitoring", Zhang et al, Fairchild Semiconductor, IEEE 2005.*

(Continued)

*Primary Examiner* — Michael D Masinick
(74) *Attorney, Agent, or Firm* — Scully, Scott, Murphy & Presser, P.C.; Yuanmin Cai

(57) ABSTRACT

System, method and computer program product for configuring and controlling a facility to perform a manufacturing process and updating a tool controlling the process according to a model employed for mapping calculated coefficients that characterize non-linear variations observed of a product to actual control parameters governing the processes/tools used by the facility during the manufacturing process. The method enables real-time control of variation in an exposure step of a patterning process using an exposure tool to minimize a non-linear variation in one or more pattern attributes by adjusting the exposure tool or the patterning process corresponding to the calculated coefficients. In the method, measurements of product attributes, obtained by finite sampling over a well defined domain, are projected onto a predefined reference mesh spanning the domain, using a physically based model comprised of functions constructed to be orthogonal and normalized over a discrete set of reference mesh locations.

23 Claims, 17 Drawing Sheets

(56) References Cited

U.S. PATENT DOCUMENTS

| | | |
|---|---|---|
| 7,580,129 B2 | 8/2009 | Yu et al. |
| 7,657,863 B2 * | 2/2010 | Iijima et al. ..................... 716/53 |
| 7,669,174 B2 * | 2/2010 | Emi et al. ........................ 716/53 |
| 7,712,069 B2 | 5/2010 | Zach |
| 7,732,109 B2 | 6/2010 | Yu et al. |
| 8,626,328 B2 * | 1/2014 | Ausschnitt ................... 700/108 |
| 2005/0254024 A1 | 11/2005 | Van Greevenbroek et al. |
| 2009/0319075 A1 | 12/2009 | Tian et al. |
| 2011/0010000 A1 | 1/2011 | Mos et al. |
| 2011/0196646 A1 | 8/2011 | Mos et al. |
| 2012/0191236 A1 * | 7/2012 | Ausschnitt ................... 700/105 |

OTHER PUBLICATIONS

Adel, et al., "The challenges of transitioning from linear to high-order overlay control in advanced lithography", Proceedings SPIE, vol. 6827, (2007).

* cited by examiner

GIVEN: 1-D MESH FUNCTIONS
$v_n(\xi) = \{v_0(\xi), v_1(\xi), v_2(\xi), v_3(\xi), v_4(\xi), \ldots\}$

CONSTRUCT: 2-D MESH FUNCTIONS IN RECTANGULAR (x,y) DOMAIN

510

$w_{nm}(x,y) = v_n(x)v_m(y) =$

515

| FUNCTION | ORDER |
|---|---|
| 1; | 0 |
| $v_1(x), v_1(y)$; | 1 |
| $v_2(x), v_1(x)v_1(y), v_2(y)$; | 2 |
| $v_3(x), v_2(x)v_1(y), v_1(x)v_2(y), v_3(y)$; | 3 |
| $v_4(x), v_3(x)v_1(y), v_2(x)v_2(y), v_1(x)v_3(y), v_4(y)$; | 4 |
| ... | |

EXPANSION: ARBITRARY VARIATION OVER DOMAIN

$f(x,y) \approx \sum_n \sum_m K_{nm} w_{nm}(x,y)$; $K_{nm}$ ARE 2-D MESH FUNCTION COEFFICIENTS

Table 950 — |Fxx|>3 correction (CORRECTED / UNCORRECTED)

| COEFF | NO MESH x | NO MESH y | COEFF | 13 x 19 MESH x | 13 x 19 MESH y |
|---|---|---|---|---|---|
| F00 | 1.38 | -0.94 | F00 | -1.24 | 0.62 |
| F10 | 0.06 | -0.69 | F10 | 0.82 | 0.67 |
| F01 | 1.28 | 5.56 | F01 | -1.35 | 0.67 |
| F20 | 2.72 | 1.13 | F20 | 2.97 | 0.34 |
| F11 | — | -0.32 | F11 | — | 0.13 |
| F02 | -0.74 | — | F02 | 1.20 | -2.04 |
| F30 | -0.05 | 1.14 | F30 | -0.04 | 1.07 |
| F21 | — | — | F21 | — | — |
| F12 | — | -3.05 | F12 | — | -1.83 |
| F03 | 3.09 | — | F03 | 2.49 | — |
| F40 | — | — | F40 | — | — |
| F31 | — | — | F31 | — | — |
| F22 | — | — | F22 | — | — |
| F13 | — | — | F13 | — | — |
| F04 | — | — | F04 | — | — |
| RAW Mn | -0.87 | 0.42 | RAW Mn | -0.87 | 0.42 |
| RAW 3s | 9.87 | 10.58 | RAW 3s | 9.87 | 10.58 |
| RES 3s | 6.98 | 11.06 | RES 3s | 5.78 | 8.69 |
| REDUCT | -29% | 5% | REDUCT | -42% | -18% |

Table 900 — full (uncorrected) coefficients

| COEFF | NO MESH x | NO MESH y | COEFF | 13 x 19 MESH x | 13 x 19 MESH y |
|---|---|---|---|---|---|
| F00 | 1.38 | -0.94 | F00 | -1.24 | 0.62 |
| F10 | 0.06 | -0.69 | F10 | 0.82 | 0.67 |
| F01 | 1.28 | 5.56 | F01 | -1.35 | 0.67 |
| F20 | 2.72 | 1.13 | F20 | 2.97 | 0.34 |
| F11 | -0.21 | -0.32 | F11 | -2.50 | 0.13 |
| F02 | -0.74 | -3.59 | F02 | 1.20 | -2.04 |
| F30 | -0.05 | 1.14 | F30 | -0.04 | 1.07 |
| F21 | 0.25 | 1.82 | F21 | 0.15 | 1.06 |
| F12 | -1.23 | -3.05 | F12 | -0.74 | -1.83 |
| F03 | 3.09 | 4.75 | F03 | 2.49 | 3.83 |
| F40 | 0.18 | 0.38 | F40 | 0.15 | 0.31 |
| F31 | -0.73 | 0.10 | F31 | -0.69 | 0.09 |
| F22 | -4.25 | 0.22 | F22 | -1.49 | 0.08 |
| F13 | 3.23 | -0.61 | F13 | 2.60 | -0.49 |
| F04 | -0.24 | -0.32 | F04 | -0.20 | -0.26 |
| RAW Mn | -0.87 | 0.42 | RAW Mn | -0.87 | 0.42 |
| RAW 3s | 9.87 | 10.58 | RAW 3s | 9.87 | 10.58 |
| RES 3s | 3.31 | 2.29 | RES 3s | 3.31 | 2.29 |
| REDUCT | -67% | -78% | REDUCT | -67% | -78% |

DISCRETE SAMPLING BASED NONLINEAR CONTROL SYSTEM

CROSS REFERENCE TO RELATED APPLICATION

This application is a continuation of U.S. patent application Ser. No. 13/012,179 filed Jan. 24, 2011 the entire content and disclosure of which is incorporated herein by reference.

BACKGROUND

The present invention relates generally to manufacturing of products generally, and in particular, semiconductor product manufacturing, and to controlling process conditions that influence and correct for manufacturing variations in resultant products, e.g., variation(s) in an exposure step of a patterning process using an exposure tool during microelectronics device manufacture.

Semiconductor manufacturing involves highly complex techniques for fabricating integrating circuits using semiconductor materials which are layered and patterned onto a substrate, such as silicon.

Photolithography is one technique that may be used to selectively process certain portions of the wafer, e.g., patterning a substrate with lines, e.g., electronic structures. For example, conventional mechanical or optical subsystems of an imaging tool aligner used during fabrication of integrated circuits, is implemented for projecting a mask pattern onto a wafer, e.g., prior to an exposure step. In a conventional lithographic system there is included a projection aligner tool that de-magnifies a pattern on a reticle (mask) and projects it onto a photo resist (photosensitive material) formed on a wafer, and has a light source, an illumination optical system from light source to reticle, and a projection optical system from reticle to a wafer.

As IC device fabrication involves many layers, it is important to ensure that the overlay, or placement of a layer relative to another layer, falls within a certain acceptable tolerance. As such, many parameters of the IC devices, for example the forming of a pattern on a region of a substrate, are monitored during fabrication to ensure that the specifications for performance and reliability may be met.

Further, as the wafer becomes larger and the design rules become tighter, it becomes more important to provide robust variation correction models that provide for real-time process parameter corrections for minimizing observed (measured) variations, e.g., non-linear spatial patterning variations, by adjusting process parameters controlled by the tools used in the lithographic patterning overlay process.

Prior approaches to nonlinear treatment of patterning spatial variation do not account for coupling that takes place between error terms. Thus, current variation correction models are not directly applicable to non-linear diagnostic and control operations. That is, in prior art techniques, the coupling among error components intrinsic to current methods of characterizing nonlinear spatial variations of patterning errors precludes robust nonlinear diagnostics and control of patterning capability.

For example, problems with current Non-linear Overlay models include: the inability to adequately represent observed variation; the exhibition of coupling among terms (non-orthogonality); the limited adaptability/extendibility; the use of poorly behaved functions; the proliferation of non-physical terms, and, the inconsistent use/results across setup/control/analysis/reporting platforms (overlay models are utilized in the lithography process control systems of semiconductor manufacturers, like IBM, and in the products of various lithography and overlay metrology equipment suppliers; notably, ASML, Nikon, KLA-Tencor and Nanometrics).

Current variation models utilize an expansion by solving equations with non-linear terms in an attempt to characterize non-linear distribution over a domain (e.g., a wafer, field, etc.) by coefficients of the expansion. For example, the current methods, practiced by both semiconductor and equipment manufacturers, implement control to minimize variation at sampled locations, i.e., fit measured error to polynomials. However, in polynomials, e.g., power series expansions, used in the current representation of the non-linearity, as currently characterized, even order terms $(1, x^2, x^4$, etc.) are coupled, and similarly, odd order terms, $(x, x^3, x^5$, etc.) are coupled. The coupled terms offset one another, resulting in unstable coefficients; the degree of instability depends on a variety of factors; including, sampling density, measurement noise, etc. Thus, current methods preclude the assignment of physical meaning to individual coefficients. Moreover, polynomials may not optimally reflect physical variation, particularly in the vicinity of domain boundaries where high order polynomial terms are rapidly varying.

As a consequence of the coupling-driven coefficient instability described above, current methods are restricted to determining coefficients corresponding to the allowed adjustments in a single control loop. This approach is not well suited to the nonlinear overlay control requirements of lithographic patterning; in which multiple control loops, consisting of overlapping subsets of allowed adjustments, pertain to the hierarchical calibration, baseline and runtime control of a tool/process based on different measurements performed at different times. Current methods do not allow the determination of a set of physically meaningful coefficients independent of the measurement and the correspondence of the coefficients to tool/process adjustment in a given control sequence.

In sum, the coupling among error components intrinsic to current methods of characterizing the nonlinear spatial variation of patterning errors precludes robust nonlinear diagnostics and control of patterning capability.

Generally, it would be highly desirable to provide a system and method that provides accurate real-time control of process parameters that minimize nonlinear process variation in a manufacturing step using a process tool.

It would be further desirable to provide a system and method that provides for accurate real-time control of a process parameter utilized in a semiconductor product manufacturing process based on measured attributes of resulting patterns/structures formed as a result of a manufacturing process.

That is, in a semiconductor product manufacturing facility, it would be highly desirable to reduce a coupling among error components intrinsic to current methods of characterizing the nonlinear spatial variation of patterning errors that preclude robust nonlinear diagnostics and control of patterning capability.

SUMMARY

There is provided a system, method and computer program product for providing accurate real-time control of process parameters that minimize nonlinear process variation in a product manufacturing step using a process tool.

Generally, in one embodiment the system, method and computer program product implements steps (e.g., programmed instructions run by a processor) for dynamically configuring and controlling a facility to perform a manufacturing process and updating a tool controlling the process according to a model employed for mapping calculated coefficients that characterize non-linear variations observed of a product to actual control parameters governing the processes/tools used by the facility during the manufacturing process.

In accordance with this general embodiment, there is provided a system and method for controlling a nonlinear variation in a manufacturing step using a process tool. The method comprises: measuring one or more attributes of a product being manufactured by said process tool at a set of one or more discrete times or locations spanning one or more finite temporal or spatial domains; selecting one or more sets of basis functions representing one or more variations in the set of one or more product attributes over each domain; constructing an orthogonal set of the set of functions from the set of one or more basis functions; fitting the orthogonal set of functions to the measured set of one or more product attributes at the set of discrete times or locations; determining, as a result of said fitting, a set of coefficients of the orthogonal set of functions; and minimizing a variation in the one or more product attributes by adjusting the process tool corresponding to one or more of the coefficients.

In a more specific aspect, in a semiconductor manufacturing process, the method enables real-time control of variation in an exposure step of a patterning process using an exposure tool to minimize a nonlinear variation in one or more pattern attributes by adjusting the exposure tool or the patterning process corresponding to the calculated coefficients. In the method, measurements of one or more product attributes, obtained by finite sampling over a well defined domain (e.g., a region such as a field/wafer in lithographic patterning), are projected onto a predefined reference mesh spanning the domain, using a physically based model comprised of functions constructed to be orthogonal and normalized over a discrete set of reference mesh locations.

Thus, in a further aspect, there is provided a method for dynamically controlling variation during an exposure step of a patterning process using an exposure tool. The method comprises: measuring a set of one or more pattern attributes at a set of discrete locations on a substrate; selecting one or more basis functions representing one or more variations in the set of one or more pattern attributes over the set of discrete locations; constructing an orthogonal set of functions from the set of one or more basis functions; fitting the orthogonal set of functions to the measured set of one or more pattern attributes at the set of discrete locations; determining, as a result of the fitting, a set of coefficients of the orthogonal set of functions; and minimizing a variation in the one or more pattern attributes by adjusting the exposure tool or the patterning process according to one or more the determined set of coefficients.

Further to these aspects, the method further includes: defining a set of reference locations distributed on the substrate, the orthogonal set of functions being constructed from the set of one or more basis functions on the defined set of reference locations.

A computer program product is provided for performing operations. The computer program product includes a storage medium readable by a processing circuit and storing instructions run by the processing circuit for running a method. The method(s) are the same as listed above.

Advantageously, in one embodiment, the system and method provides for control of overlay parameters that minimize variation on a reference mesh to result in improved match to observed variation and improved boundary condition behavior, e.g., at a Field edge and a Wafer edge.

DRAWINGS

The objects, features and advantages will become apparent to one skilled in the art, in view of the following detailed description taken in combination with the attached drawings, in which:

FIG. 1 depicts generally, an example system for modeling and providing feed-back control for adjusting parameters during a product manufacture;

FIGS. 2A and 2B are representative schematics depicting a method 100 used to characterize variation and determine coefficients for performing real-time tool adjustment in the general sense of any product, as depicted in FIG. 2 in one embodiment; and, a method 100' of determining coefficients for performing real-time tool adjustment to correct for patterning or overlay errors in the example context of manufacture of a semiconductor device as shown in FIG. 4;

Figure 6:
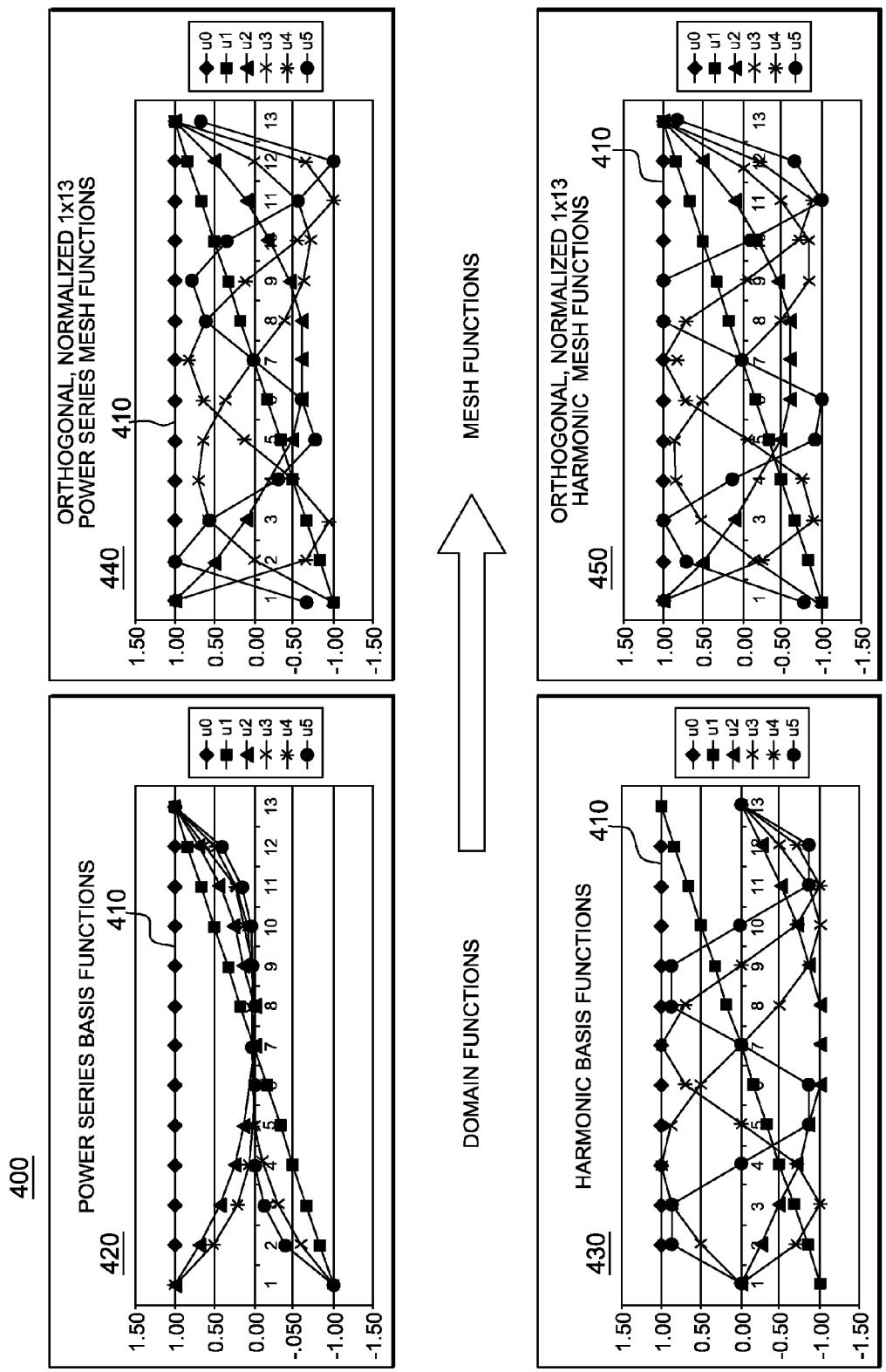
Figure 9A:
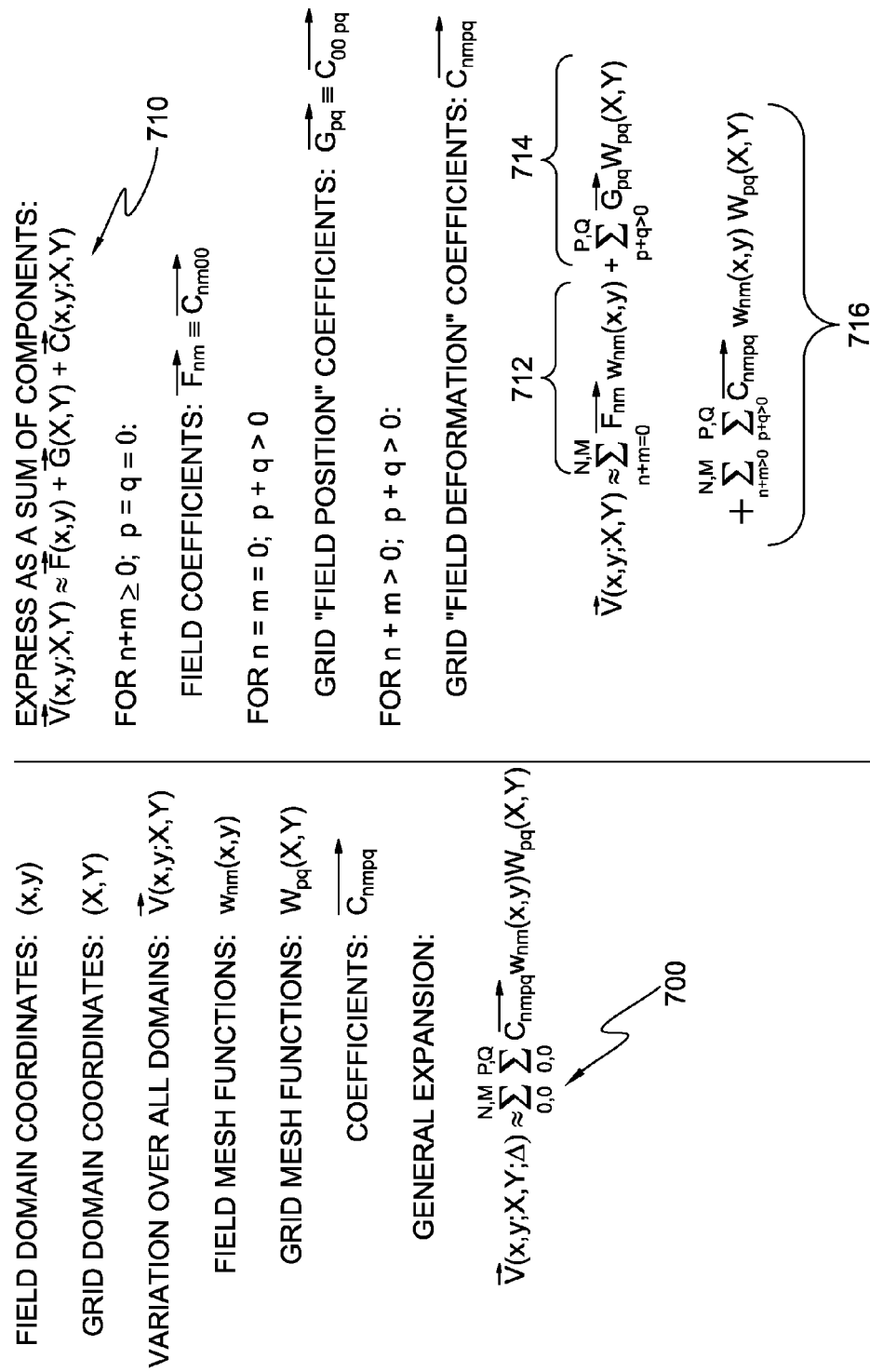
Figure 9B:
Figure 10:
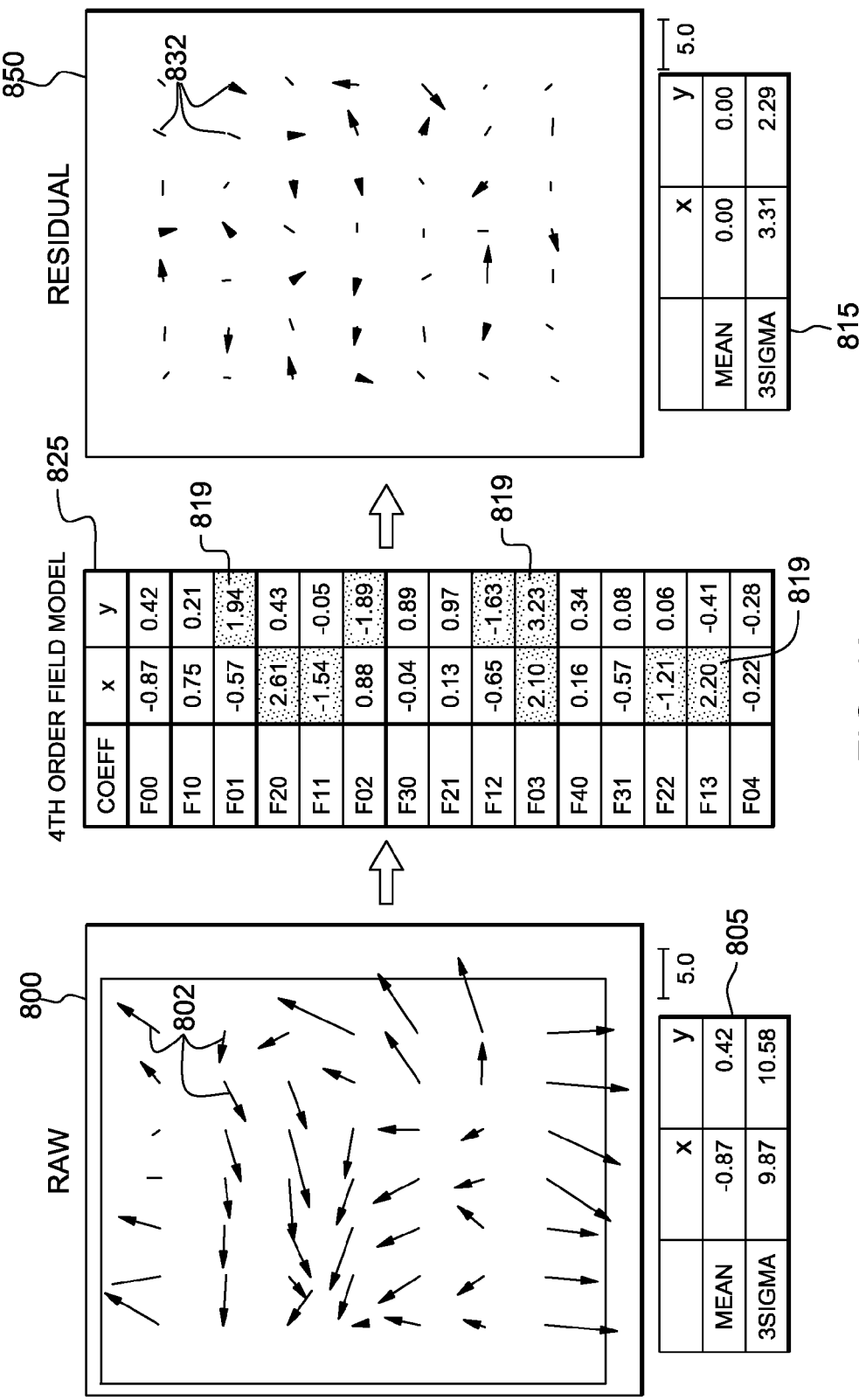
Figure 12:
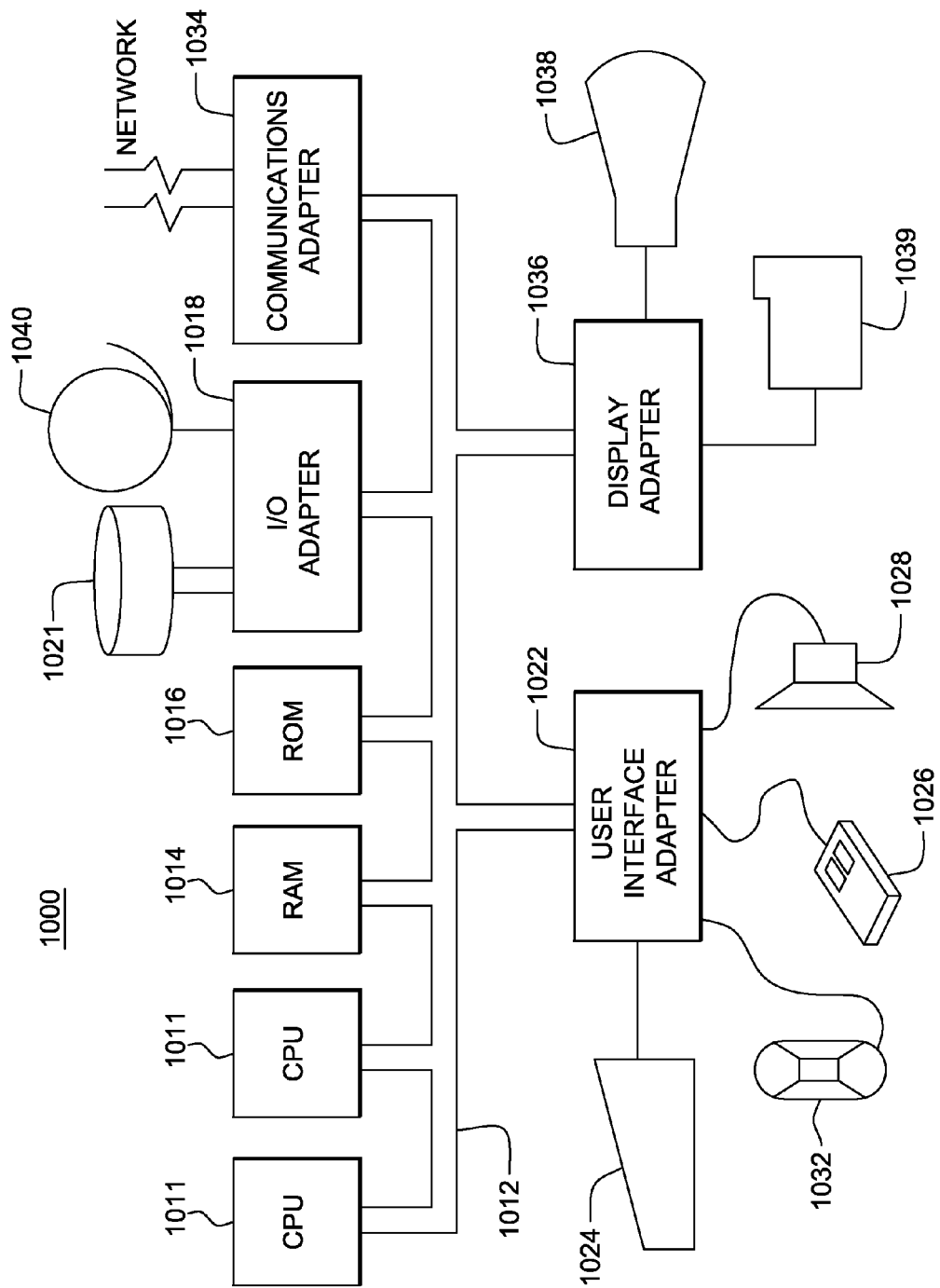

FIG. 6 visually depicts example constructed mesh functions 440, 450 corresponding to respective domain functions 420, 430 formed of respective power series and harmonic series expansions in one embodiment;

FIG. 7 depicts a resulting orthogonalized set of mesh equations 500 for modeling variation of a general 2-dimensional (2-D) case such as an example rectangular domain, e.g., an exposure field;

FIGS. 8A-8D depict generation of example 2-D coefficients $K_{nm}$ that can be used for real-time adjustment variations in according with an example 2-D variation modeling scenario;

FIG. 9A depicts a single general expression of mesh functions 700 constructed to model all expected 2-D variations on the mesh for performing an overlay control, and provide the ability for determining adjustments for (i.e., correcting), at once, field variation components, grid variation components, and coupled field and grid variation components;

FIG. 9B shows a modified sum of components expression 710' for determining values of all field $F_{nm}$ coefficients, grid $G_{pq}$ "field position" coefficients and grid "field deformation" coupled coefficients $C_{nmpq}$ at once, according to one embodiment;

FIG. 10 depicts a plot 800 of 2-D vectors corresponding to an example raw measured Field variation (in x- and y-direction) at discrete locations (samples) and a plot 850 depicting corrected variation errors resulting in the residuals after adjustment based on calculated coefficients;

FIG. 11 shows resulting grids 900A, 0900B, 950A, 950B indicating comparison of resulting Field coefficients corresponding to both correctable and uncorrectable error components computed in a no-mesh case and computed for the mesh case (using an example 13×19 reference mesh) in one embodiment; and, FIG. 12 illustrates an exemplary hardware configuration for implementing real-time process steps depicted in the flow charts depicted in the FIGS. 2, 3 and FIGS. 5, 7 and 9A,B in one embodiment.

DETAILED DESCRIPTION

As referred to in the description herein below directed to techniques and apparatus for modeling and providing real-time parameter adjustment (control) during manufacture of products, e.g., semiconductor devices.

Figure 1:
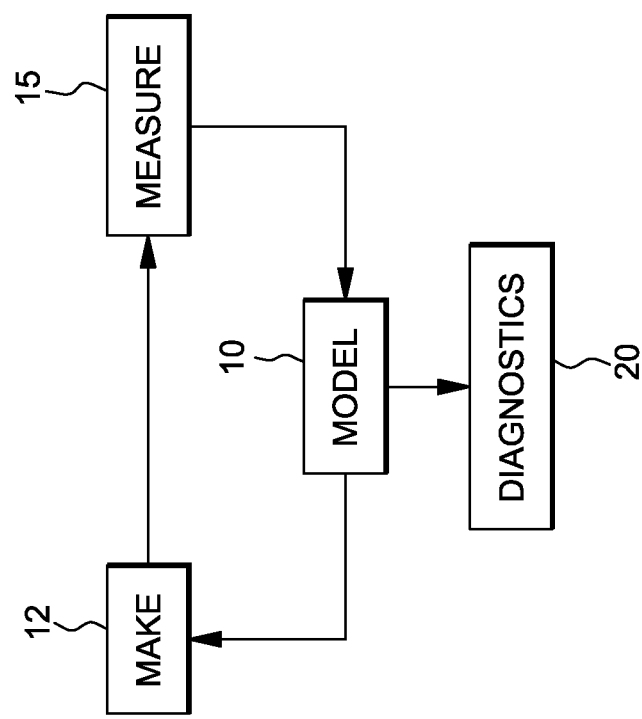

As shown in FIG. 1, a physical parametric model is central to diagnostics and control. For example, process controls used for controlling equipment/tools during a manufacture of a product, e.g., a semiconductor product 12 are adjusted in real-time based in accordance with the characterization of the errors obtained by measuring attributes 15 of the resulting product, e.g., patterns/structures formed as a result of manufacturing processes. The model 10 is used for mapping the calculated coefficients that characterize the non-linear spatial errors observed to actual control parameters governing the processes/tools used by the manufacturing facility equipment during the manufacturing process 12.

In one embodiment, as will be described in greater detail herein, patterning measurements obtained by finite sampling within a patterned substrate domain, for example, are projected onto a predefined reference mesh using a physically based model comprised of functions constructed to be orthogonal and normalized over the mesh locations. The techniques described herein enables the simultaneous determination of control and tracking coefficients; correlation among different sampling plans; optimization of sampling; comparison and matching among multiple tools/processes; ease of model extension; common units for all model coefficients; and, the techniques applied are applicable to any set of functions; and, are applicable to the nonlinear characterization and control of any parameter. In the context of a semiconductor device manufacture, the techniques applied are applicable to the nonlinear characterization and control of parameter including, but not limited to, overlay, pattern placement, dose, focus, critical dimension (CD), SWA, film thickness, NA, sigma, etc.

In example embodiments described herein, the model 10 generated can be used to characterize the nonlinear parameter variation applicable to any manufacturing process, e.g., generally patterning, e.g., including overlay error or pattern placement error (PPE) across the field of a scanner which is used to pattern a sample, such as a semiconductor wafer or device. Measurement and control of patterning processes in the manner as described herein provides ability to adjust any observed deviations of any uniformity and to eliminate deviations (e.g., patterning errors). For example, in the case of pattern placement or overlay processing, it is the location of the patterns that are to be adjusted, for case of CD uniformity, it may be the size of the feature that is to be adjusted. The approach addresses these kinds of errors and more particularly, non-linear spatial variations of errors, e.g., cubic, quadratic, or fourth order errors as process runs across a field or wafer.

The technique particularly avoids the coefficient coupling phenomena, and enables a more robust determination of the coefficients so that they can be used in control systems to minimize the non-linear errors. The control is used to minimize errors in a real processing environment according to the schematic diagram shown in FIGS. 2A and 2B discussed herein below.

In the construction of the model 10 for characterizing variation (errors) in the embodiments described herein, reference is made to the following terms:

Domain: Datum representing a space (spatial domain), a time (temporal domain) or a combination of space and time. In an example semiconductor patterning process, a spatial domain includes a datum representing a semiconductor substrate region over which patterns are printed (e.g., field or multiple field domain(s), grid domain(s), wafer), or a change in an attribute over time intervals (temporal domain).

Reference Mesh (or Mesh): A set of discrete locations or times spanning a domain; In one embodiment, the reference times or locations are distributed uniformly and symmetrically about a center of each domain. In a preferred embodiment, the granularity of the mesh is matched to the granularity of the adjustment capability of the tool or process over the domain. Includes datum representing reference mesh(es) stored in a memory storage device, and are selected for use in the model based on its ability to make corrections in a process or tool. The mesh(es) are generated, a priori, and are subsequently used in computations that match orthogonal functions used in making real-time corrections of a process, to the actual abilities (adjustable "knobs") of the process or tool. In the context of patterning and overlay control, field meshes, and grid meshes are implemented in the modeling selected for a given process (or tool) based on the ability to correct that process or tool.

Orthogonal functions: A set of functions continuous over a domain for which the product of any pair of different functions in the set integrates (on the continuum) or sums (on a set of discrete locations or times) to zero over the domain.

Domain functions: Functions stored in a memory storage device corresponding to the physically meaningful set of correctable and non-correctable tool/process spatial or temporal degrees of freedom requiring control/diagnostics within a given domain. In the example context of patterning, printing of a line or overlay of two fields on a substrate.

Mesh functions: A set of domain functions orthogonalized and optionally normalized on the mesh; e.g., functions normalized to have a maximum amplitude of 1 on the mesh for which the product of any pair in the set sums to zero at the mesh locations spanning the domain. The sets of mesh functions are stored in a memory storage device, and are generated for use in the model in accordance with a method described herein below with respect to FIG. 5.

Overlay: Relative position of two or more patterns on a substrate on one or more patterning layers.

Pattern placement: Absolute position of patterns on a substrate on one patterning layer.

Alignment: Act of minimizing overlay and pattern placement errors.

In one aspect, there is provided a computer-implemented method, computer program product and fabrication technique referred to as COSMIC (Comprehensive Overlay and Stitched Model for ICs) which is a general method of nonlinear spatial deconstruction not only in the context of an overlay parameter, but applicable to all sampled parameters, e.g., dose, focus, CD, SWA, film thickness, etc., in a semiconductor manufacturing process.

In one aspect, the computer-implemented method and computer program product includes instructions run by a host or processor system for configuring and controlling a manufacturing facility to perform a semiconductor fabrication process and updating the equipment performing the process according to the model employed for mapping calculated coefficients that characterize the non-linear spatial errors observed to actual control parameters governing the processes/tools used by the manufacturing facility equipment during the manufacturing process.

In one aspect, the method includes measuring a set of one or more pattern attributes at a set of discrete locations of a pattern formed on a substrate. Then, there is selected a set of functions (domain functions such as field/grid functions) representing one or more variations in the set of one or more pattern attributes over the set of discrete locations. There is further defined a set of reference locations (reference mesh) distributed over the field, e.g., substrate. Then, the method includes constructing an orthogonal set of the set of functions on the set of reference locations, and, determining coefficients of the orthogonal set of functions (mesh functions) orthogonal to the set of functions (e.g., field grid functions) by fitting the orthogonal set to the measured set of one or more pattern attributes at the set of discrete locations. Ultimately, a variation in the one or more pattern attributes can be minimized by adjusting the exposure tool or the patterning process corresponding to one or more of the coefficients.

Figure 2A:
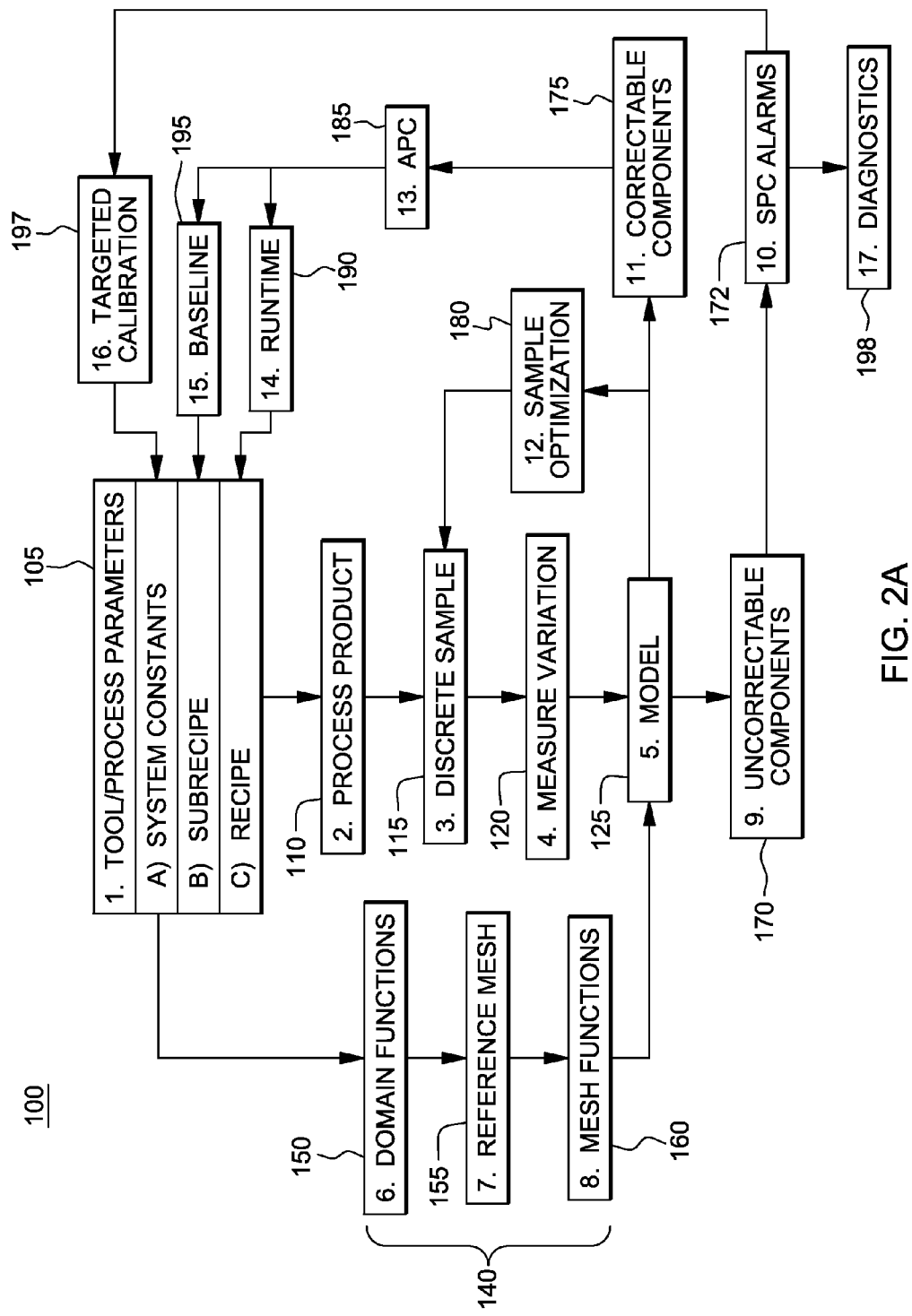
Figure 2B:
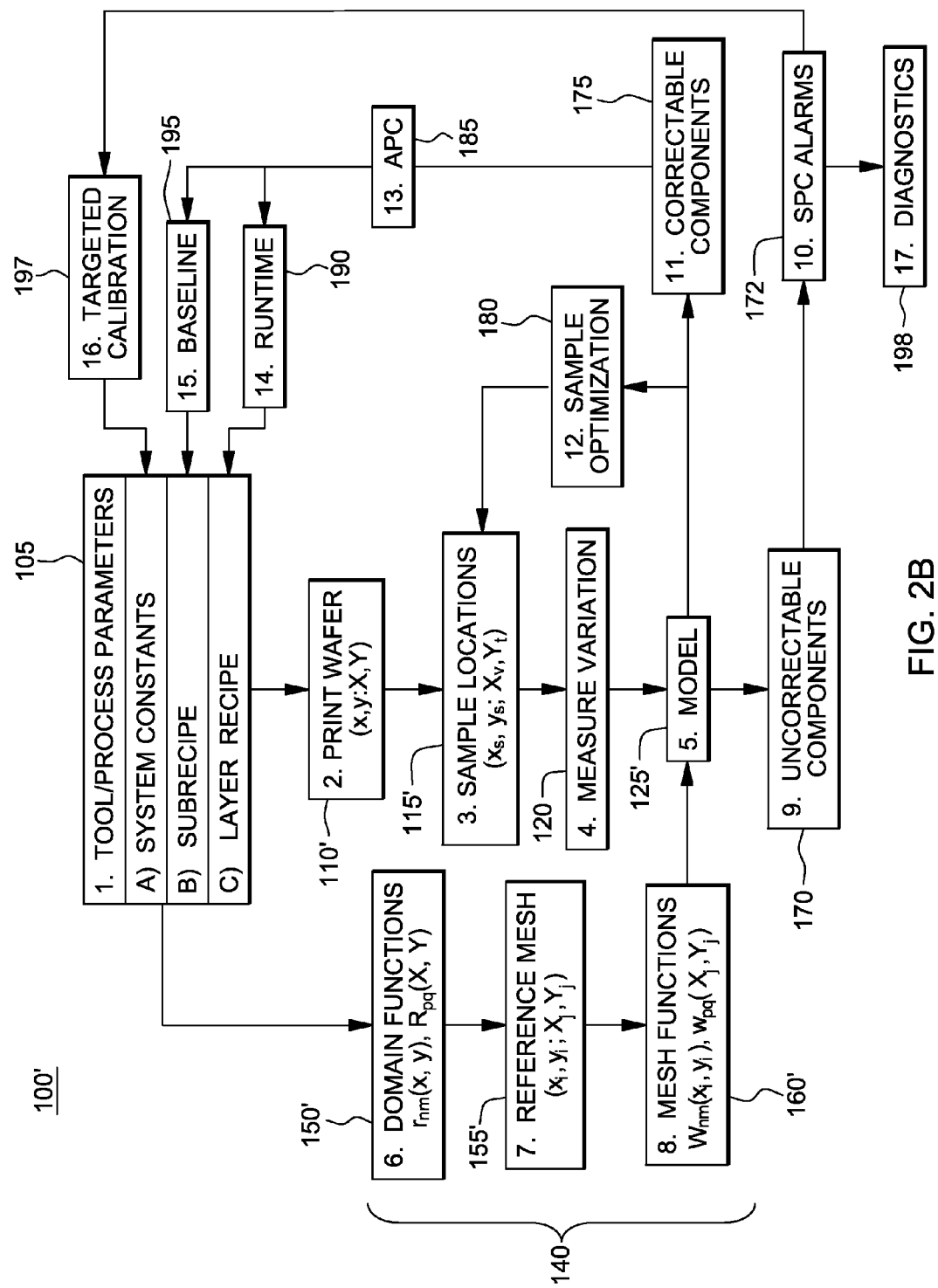

FIGS. 2A and 2B depict a non-linear control method in accordance with one embodiment. FIG. 2A generally depicts the method 100 for performing real-time tool adjustment in the general sense of any product in one embodiment; and, FIG. 2B particularly depicts a method 100' of determining coefficients for performing real-time tool adjustment to correct for patterning or overlay errors in a particular example context of manufacture of a semiconductor device. At a first step 105, the tool/process parameters are first determined and stored for use in the model as described with respect to steps 140. These parameters, for example, may include "fixed" and dynamically adjustable parameters governing tool/process performance, including: a) System constants that are set during initial setup or recalibration of the tool/process (e.g., based on pre-established calibration procedures) and may not change between calibrations. Moreover, time scales in which these parameter types are adjusted is long, e.g., on the order of months; b) Sub-recipe parameters, for example, apply to all products/layers being patterned based on correction feedback from monitor wafers. Time scales in which these Sub-recipe parameter types are adjusted is medium, e.g., on the order of days; c) Layer recipe parameters apply to a particular product/layer/mask; including layout specification and parameters based on correction feedback from similar previously patterned process streams. Time scales in which these Layer parameter types are adjusted is short, e.g., on the order of minutes/hours. In one example embodiment applied to overlay control, fixed and dynamic parameters are adjusted in real-time and govern tool alignment performance.

Figure 3:
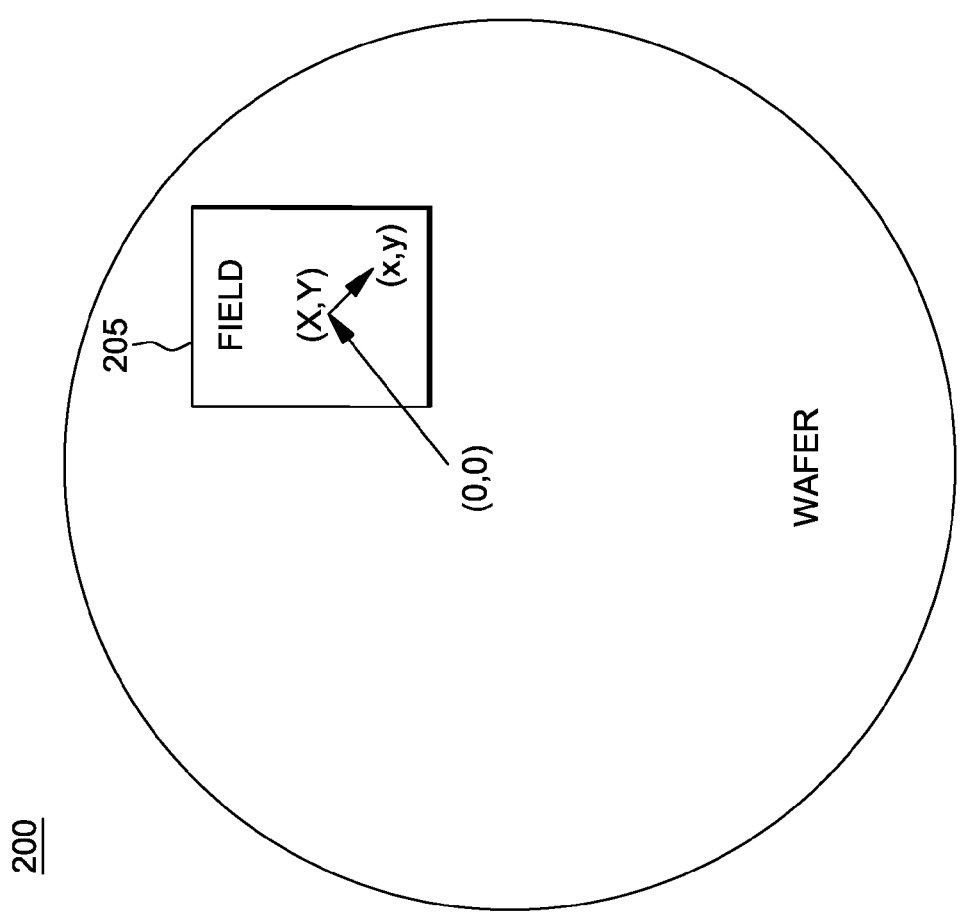
FIG. 3 depicts a wafer 200 having a mask pattern formed on a field 205 thereon located at wafer Field/Grid points (x,y:X, Y) in one example embodiment.
Figure 4:
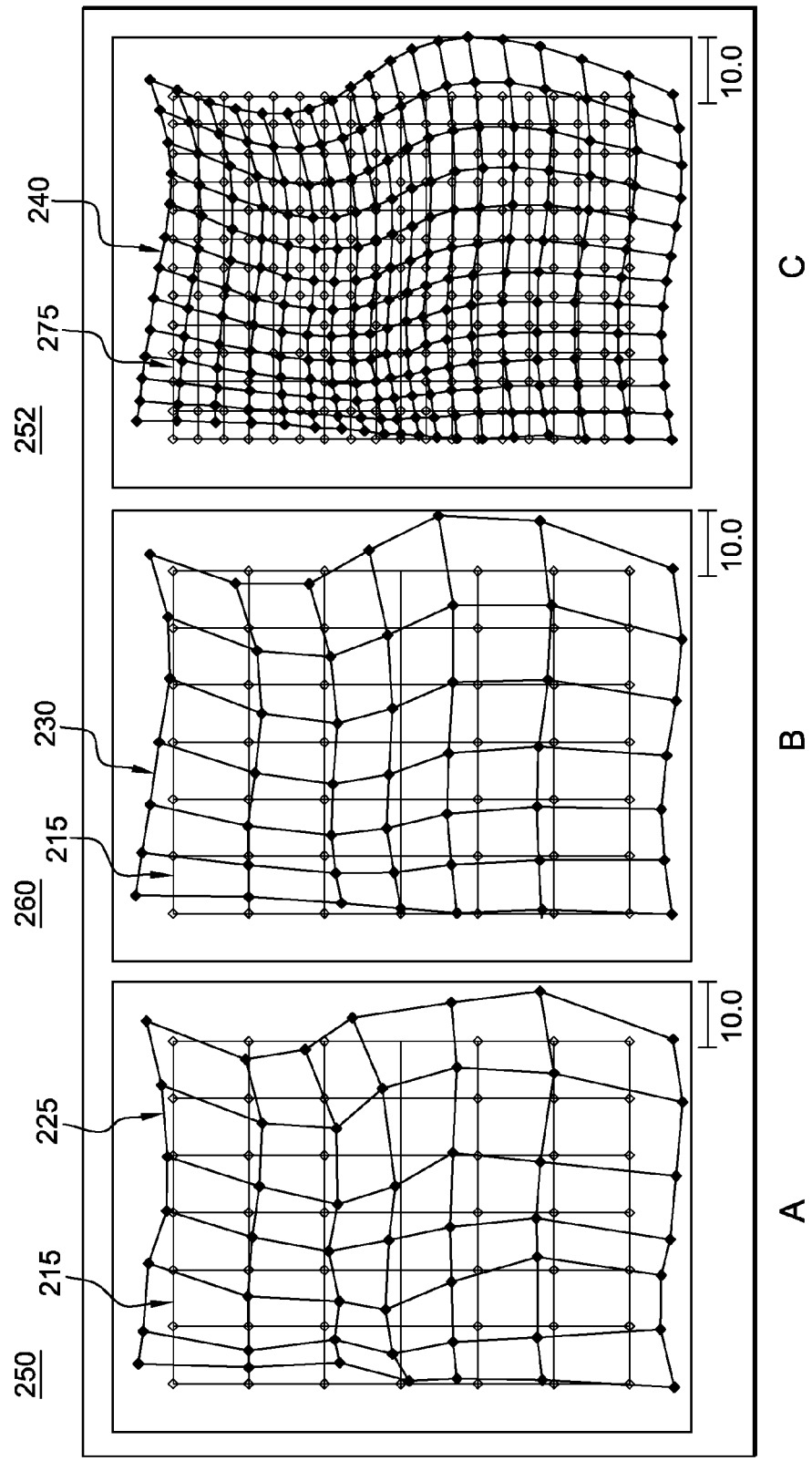
FIG. 4 depicts an example projection 250 of raw measured variation on a reference mesh in the generation of domain functions having a mask pattern formed thereon depicted as patterned elements at Field/Grid points (x,y:X,Y) in one example embodiment.

In FIG. 2A, at a next step 110, given the above parameter settings, there is then completed a manufacturing process step. For example, in the context of semiconductor patterning and overlay control, as shown in FIG. 2B at 110', based on tool/process parameters indicated at 105, a wafer is printed for example, by exposing and developing or producing a mask pattern on the wafer. In an embodiment, the tool may be a step-and-scan exposure tool such as an ASML TwinScan. The full wafer, typically of 300 millimeter diameter, may be patterned by successively scanning and stepping individual rectangular fields of tens of millimeter dimensions per side containing features of tens of nanometer dimensions according to techniques known in the semiconductor device processing art. The location of each pattern element is defined by Field coordinates (x,y) that define the within-field location, e.g., a location with respect to the center of a 25×30 mm rectangular field, and Grid coordinates (X,Y) that locate the center of the field with respect to the center of a 300 mm wafer. As an example, FIG. 4 depicts a semiconductor wafer 200 having a mask pattern formed thereon depicted as patterned elements at Field/Grid points (x,y: X,Y) defining a field 205 at a grid X,Y location. Thus, at corresponding step 110' in FIG. 3, in the example application to overlay control, given the above alignment parameter settings, there is performed steps of aligning, exposing and developing mask patterns on the wafer Field 205. In another manufacturing context, variation may be introduced over a time domain (e.g., a temperature profile over a fixed time interval).

In FIG. 2, at a next step 115, there is generally performed establishing a minimum set of measurements at discrete locations. In the context of semiconductor patterning and overlay control, as shown in FIG. 3 at 115' a minimum set of measurements is taken by spanning the Field (s-subscript) and/or Grid (t-subscript) domains that enable robust determination of the spatial distribution of pattern variation over the field/wafer. That is, there is established a minimum set of measurement sites spanning the domain that is optimized with respect to a selected predefined reference mesh. In the example application to overlay control, there is established a minimum set of overlay or pattern placement measurement locations spanning the Field 205 of wafer 200. In another context, a minimum set of measurements may be established at discrete times over a time domain (e.g., to sample a temperature profile over a fixed time interval).

Then, in FIG. 2 at 120, there is generally performed measuring of relevant product attributes at the sample substrate sites by appropriate sensors and monitoring devices located in the semiconductor fabrication and measurement tools implemented; and for the example context of semiconductor patterning and overlay control, as shown in FIG. 3 at 120' measuring spatial distributions of pattern variation over the field/wafer. Particularly, in the overlay control context, there is obtained a variation of the measured relevant pattern attributes (e.g., overlay, pattern placement, dose, focus, critical dimension CD, SWA, etc.) at sample locations. In another context, measurements may be performed at the above-established finite set of times over a time domain (e.g., to monitor a temperature profile over a fixed time interval).

Returning to FIG. 2 at 125, generally a model is then applied for controlling the observed variation and provide for real-time process parameter correction and diagnostics. In the context of patterning overlay control, as shown at FIG. 3 at 125', the model is set up to include a set of orthogonalized mesh functions that are continuous and orthogonal over a specific domain (e.g., region upon which patterns are printed such as a field). Particularly, in the modeling, the mesh functions are used to model the variation (non-uniformity resulting from a real-time patterning process) as described below with respect to FIG. 5. Then there are performed computing coefficients of the orthogonalized mesh functions that map either to real time process controls or to monitors for process diagnostics. In one embodiment, the determining of orthogonal mesh function coefficients may be performed using a least squares fit to measured variation.

As further shown in FIGS. 2A, 2B and as will be described in greater detail, the generated model 140 includes the a priori construction of sets of mesh functions 160, 160' over the relevant domains, i.e., prior to running the actual process in real-time production at 125, 125'. These sets of mesh functions are utilized during real-time production to determine coefficients that are mapped to and used to adjust tool/process parameters or to diagnose out-of-control tool/process conditions. The constructing of the model 140 includes steps 150, 155, 160. At 150, there is generally performed generating of domain functions corresponding to the physically meaningful set of correctable and non-correctable tool/process degrees of freedom requiring control/diagnostics. In one embodiment, the nonlinear domain functions may be a set of polynomials like the above-mentioned generally utilized power series functions of 316, FIG. 5. In a second embodiment, the non-linear domain functions may be a set of harmonic series functions of 317, FIG. 5. The harmonic series functions plotted in 430, FIG. 6 are better behaved near the domain boundaries than the power series functions plotted in 420, FIG. 6. In the context of overlay control and patterning there is generated at 150' domain functions corresponding to tool/process alignment spatial degrees of freedom requiring control/diagnostics, e.g., Field/Grid domain functions. Further, at 155, FIG. 2A, there is performed selecting of a reference mesh corresponding to requirements for tool/process variation and control. In the context of overlay control and patterning there is generated at 155' a reference mesh comprising a pre-defined sets of locations, Field/Grid locations, etc., corresponding to requirements for tool/process spatial variation and control, e.g., patterning and overlay variation and control. Further at 160, FIG. 2A, there is generally performed the constructing of the Mesh functions which orthogonalize and normalize the domain functions on the respective reference mesh sets. Orthogonalization establishes that the summation of the product of any two distinct mesh functions over the reference mesh locations within the domain is zero. Normalization establishes that the maximum absolute amplitude of the mesh function on the reference mesh locations within the domain is one. In the context of overlay control and patterning, at 160', FIG. 2B, there is generally performed the constructing of the Mesh functions which orthogonalize and normalize the Field/Grid domain functions on the respective Field/Grid reference mesh sets. The generated model used at 125, FIG. 2A comprises the set of mesh functions that are continuous over a set of domains specific to a manufacturing tool/process. The generated model used at 125', FIG. 2B comprises the set of mesh functions that are continuous over a set of domains in the context of wafer patterning; namely, the Field/Grid domains.

Continuing in FIG. 2A, 2B, as will be described in greater detail herein below, in the generating of the orthogonal mesh functions for the model at 160', there is determined either the presence of uncorrectable components, i.e., error components that are not dynamically correctable such as alignment error components; including non-adjustable mesh function coefficients and residual errors (errors that do not correspond to any combination of mesh functions) at 170, or, at 175, the components that are correctable, e.g., error components, corresponding to the mesh function coefficients, that are dynamically adjustable. For, any uncorrectable error that occurs, the method may include at 172 generating any (Statistical Process Control) SPC alarms as SPC techniques may be implemented to flag out-of-control conditions on components (e.g., alignment components) that are not dynamically correctable.

As a measure of optimizing the samples taken at step 115' when a selected set of measurement locations spanning the Field (s-subscript) and/or Grid (t-subscript) are taken, a sample optimization may be performed at 180 to ensure consistency of sampling locations with the mesh functions such that known sources of systematic variation (e.g., overlay and pattern placement variation) are identified and characterized up through the maximum required nonlinear order.

There may be further performed at 180 (FIG. 2A, 2B) a co-optimization of reference mesh/sampling to capture highest meaningful order of variation. For example, an outermost sample must be on or within the reference mesh; and coordinates normalized to the extremes of each reference mesh. In one embodiment, co-optimizing of the sampling and the reference mesh may include: coincident sampling, where sampling and measurement constraints allow, sampling coincident with the mesh sites to eliminate coupling among the coefficients of all functions constructed to be orthogonal over the Reference Mesh. In the coincident sampling embodiment, the coefficient of each mesh function can be determined by a summation of the product of the mesh function and the measured data over the Reference Mesh divided by the square of the function. Co-optimizing may additionally include representative sampling: a type of sampling that can be performed where constraints (target location, measurement time, etc.) dictate less than coincident sampling as long as the sample spans the same domain as the reference mesh, and has a maximum spatial frequency commensurate with the highest order functions in the model according to the Nyquist criterion. In the representative sampling embodiment, the coefficients are determined by a LSF of the measured data to the model functions.

As a measure of correcting parameters of a next product run, for example, APC (Advanced Process Control) techniques are applied at 185 to provide feedback tool/process corrections (e.g., process alignment correction in the context of overlay control). Thus, for example Runtime corrections of parameters (e.g., exposure alignment parameters in the context of overlay control) of the next product run (or "lot") may be applied at 190 based on historical data from identical or similar process streams. For example, these runtime corrections are based on the coefficients that are fedback at 190 and used according to control schema for adjusting product alignment parameters that apply to the minimization of overlay error for a particular product/layer/mask. As a further example, Baseline Corrections of the exposure alignment parameters of all subsequent product and monitor runs may be applied at 195 that are based on historical data from monitors patterned with a test mask. In general, Baseline corrections can be of a higher nonlinear order than Runtime corrections because the test mask layout and infrequent measurement for Baseline control enables much denser sampling than the product mask layout and frequent measurement for Runtime control.

Subsequent to the generating of any SPC alarms, the method returns to perform a targeted calibration at 197, i.e., a recalibration triggered by SPC out-of-control alarms on uncorrectable error components that correspond to established calibration procedures. In the context of overlay control, this may trigger an alignment recalibration.

Furthermore, diagnostic procedures may be performed at 198 as triggered by SPC out-of-control alarms on uncorrectable error components that do not correspond to established calibration procedures.

General 1-D Scalar Model

Figure 5:
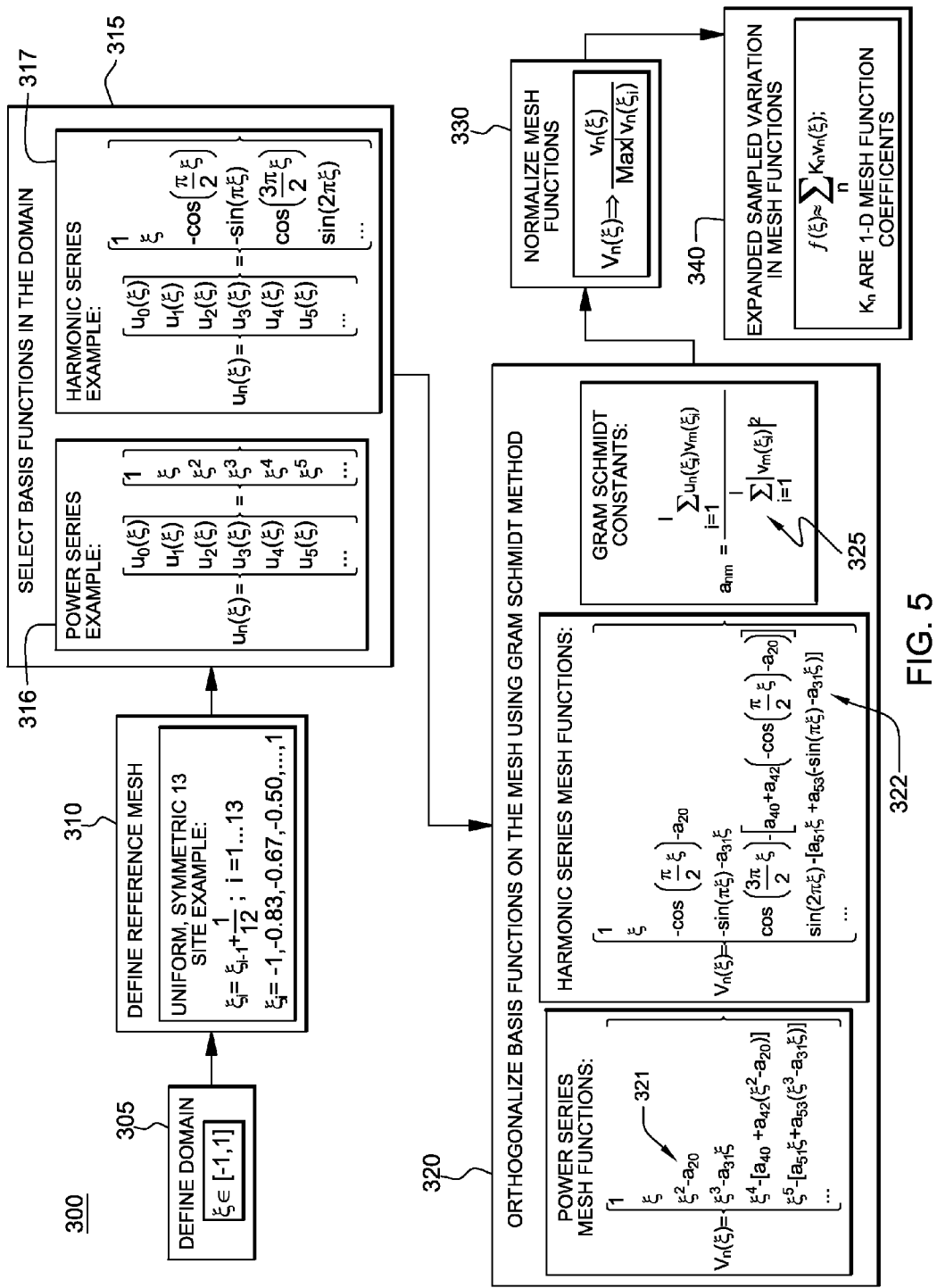
FIG. 5 depicts a methodology for constructing mesh functions used in the model for characterizing variation and determining coefficients for performing real-time tool adjustment in one embodiment.

As shown in FIG. 5, in one embodiment, a method 300 of constructing the orthogonal mesh functions, e.g., for field and grid, as performed at 160', FIG. 2B, includes the following steps:

1. At 305, defining domain(s) including the generating of Field (e.g., x,y coordinates spanning field 205) and a Grid (X,Y coordinates of field centers spanning wafer 200). As shown in FIG. 5 there is depicted an example general 1-dimension domain, e.g., normalized from $[-1, 1]$; It could be a line, e.g., a row or column in a field, a row, column in a grid, or a stitched row or column between two overlapping adjacent fields. The domain may be applicable to domains of multiple dimensions, 2D, 3D, etc., and may include a temporal component.

2. At 310, selecting a reference mesh over each domain. Thus, there may be fixed "reference meshes" of 1D locations, 2D (e.g., 7×7, 13×19) matrix of locations, 3D, etc. As shown in FIG. 5, the reference mesh for the example line ($\xi \in [-1,1]$ domain), is a division of the line into "i" segments, e.g., a number of multiple equal length segments defined by a set of points, e.g., 12 segments according to 13 points (i=1, 2, . . . , 13) such as the 1D reference mesh 410 shown in FIG. 6. It should be understood that, in general, the granularity of the reference mesh (e.g., density of locations) need not necessarily match the granularity of the measurements taken (sampling) during a process step but only match the ability to correct the process, i.e., the granularity of sampling is independent of the granularity of how corrections are being made while maintaining ability to make orthogonal tool corrections (e.g., turning one tool "knob" would not effect another "knob"). As will be described, when implementing the model, at step 125 (FIG. 2A, 2B), the fitted model projects variation observed at the sample locations onto the reference mesh to implement control/diagnostics based on the reference mesh variation.

FIG. 4A depicts an example projection 250 of raw sampled data 225 onto an example reference mesh 215, e.g., a 7×7 corresponding to a field domain 205 as shown in FIG. 3, in accordance with one aspect, and particularly shows the resultant deviation (variation) with respect to the reference mesh 215. For example, this depicts a result of processing step 120 in which the spatial distributions of pattern variation over the field/wafer are sampled (measured). FIG. 4B shows the generated model 260 including orthogonalized mesh functions 230 corresponding to the sampled data in FIG. 4A. In particular, FIG. 4B depicts an example reference mesh 215 of a density that corresponds to the sampled variation locations on the domain. In an alternate embodiment, there is shown a corresponding generated model 270 including orthogonalized mesh functions 240 corresponding to the sampled data in FIG. 4A however, shown on a reference mesh 275 of increased granularity, a 13×19 mesh 275 in the example shown in FIG. 4C. That is the reference mesh is finer than the sampling and interpolation is performed where there was no actual measurement, i.e., interpolate between a relatively sparse sampling to a much finer mesh. The orthogonalized functions are defined on a much finer mesh. Thus, if there is an ability to correct on a 13×19 mesh and the mesh functions are orthogonalized on the 13×19 mesh, then the 7×7 sample can be projected on the 13×19 mesh and make a 13×19 "correction" based on a 7×7 sample. Thus, in the model the corrections are determined independent of one another.

3. At 315, there is performed selecting a set of basis or domain functions in the defined domain. In one embodiment, as shown in FIG. 6, the set 400 of basis functions are selected, a priori, and are continuous over the defined domain. Example domain functions may include, but are not limited to: a power series expansion 420, e.g., a Modified Legendre/Zernike polynomial, or a harmonic series expansion 430, e.g., a Modified Fourier series. These example domain functions 420, 430 are continuous functions having no relationship to the points on the reference mesh. The set domain functions are used to model an attribute variation. In one aspect, a criteria for selecting the basis or domain functions is one that can represent many variations, e.g., are complete over the domain such that any observed variation can be represented in that domain. Given a priori knowledge of a variation that may be expected over the domain, special basis functions may be selected that can represent that variation. The method can be applied to any set of functions. In FIG. 3, a set of basis functions can be represented as functions $u_n(\xi)$, where $\xi$ corresponds to the domain (set of points), the "n" corresponds to the order of variation that is intended to be captured. For example, n=0 is order 0 and in patterning corresponds to a translation over the domain, in pattern placement terms, n=1 may correspond to a linearly varying displacement over the domain (e.g., a rotation or a magnification over the domain), n=2 may correspond to a quadratic or parabolic variation, e.g., a "bow" over the domain.

4. Returning to FIG. 5, at 320, there is performed the generating of a set of mesh functions by orthogonalizing the domain functions on the selected reference mesh. In one embodiment, the Gram-Schmidt technique that is used includes a method for orthonormalising a set of vectors in an inner product space (see, e.g., http://en.wikipedia.org/wiki/Gram%E2%80%93Schmidt_process, incorporated by reference herein), or like equivalent may be used. In the example embodiment shown in FIG. 6, a set of mesh functions 440 are computed as an orthogonalized set of the selected power series expansion domain function set 420 as evaluated at the reference mesh locations of the selected mesh and represented as an example set of functions $v_n(\xi)$ at 321, FIG. 5.

5. Further in FIG. 6, a set of mesh functions 450 are computed as an orthogonalized set of the selected harmonic series expansion domain function set 430 as evaluated at the reference mesh locations of the selected mesh and represented as an example set of functions $v_n(\xi)$ at 322, FIG. 5. As shown in FIG. 5, the generated mesh functions $v_n(\xi)$ 321, 322 are combinations of domain functions and are controlled by constants, e.g., Gram-Schmidt constants 325. These constants are derived from the domain functions by evaluating them at the defined reference mesh locations (e.g., constants may be expressed as summations over the "i" mesh locations) and are unique to the reference mesh selected (different mesh used will result in different coefficients) and are determined in correspondence with the order n. FIG. 6 illustrates how the domain $u_n(\xi)$ functions change when they are orthogonalized in the 1 D case to $v_n(\xi)$. In the power series expansion, the functions change fairly dramatically, but for the harmonic series expansion the change is more subtle.

6. Returning to FIG. 5, at 330, there is performed the step of normalizing the set of mesh functions $v_n(\xi)$. This can be an optionally performed. It ensures that a maximum value of the function on the mesh is equal to 1.

7. Finally, in FIG. 5, at 340, once the mesh functions $v_n(\xi)$ are determined (orthogonalized and normalized on the mesh locations "i"), there is performed the determining of the coefficient values, $K_n$, by fitting the measured values $f(\xi_s)$ of the variation that was observed (measured values of attributes at the discrete sampled points $\xi_s$ within the established domain) to a model expressed as an expansion in the set of established mesh functions, i.e., $v_n$ evaluated at $\xi_s$, i.e.:

$$f(\xi_s) = \sum_n K_n v_n(\xi_s) + \varepsilon(\xi_s)$$

where n is the order of the variation being corrected, $K_n$ are 1D coefficients of mesh functions to be determined, $f(\xi_s)$ the measured values of samples at discrete points of the domain, and $(\xi_s)$ is the residual error between the measured values and the model. In one embodiment, the sampling points "s" could be coincident with the reference mesh locations "i"; in which case the coefficients can be expressed as summations:

$$K_n = \frac{\sum_{s=i} f(\xi_s) v_n(\xi_s)}{\sum_{s=i} |v_n(\xi_s)|^2}$$

In a general embodiment, the sampling points "s" are not coincident with the mesh locations "i" (and there could be fewer sampling points than mesh locations); in which case the coefficients must be determined by adjusting the values of $K_n$ to minimize the square of the residual error (difference between the measured and modeled terms); a well-known procedure know as a least-squares fit; namely:

$$\text{Minimize}[\varepsilon(\xi_s)]^2 = \text{Minimize}\left[f(\xi_s) - \sum_n K_n v_n(\xi_s)\right]^2$$

The coefficients $K_n$ are the magnitudes of a particular component of the variation, e.g., a component corresponding to a particular orthogonal function. Thus, for example, knowing the value of the variation, to correct a process, a tool knob corresponding to a particular coefficient $K_n$ may be adjusted by an opposite value, i.e., by a value $-K_n$.

General 2-D Scalar/Vector

FIG. 7 depicts the resulting orthogonalized set of equations 500 for a general 2-dimensional (2-D case). For example this may include an example rectangular domain, as in an exposure field. For this case, the constructed 2-D mesh functions 510 include results of the 1D case. That is, in the 2-D case, e.g., modeling a variation in a rectangular domain, the generation of (orthogonolized) mesh functions $w_{nm}(x,y)$ includes a product of sets of new mesh functions $v_n(x)$ and $v_m(y)$, where x are y locations within the established 2-D domain and n, m representing respective order of variations. As shown in FIG. 7, constructed 2-D mesh functions 510 are formed generally from a product $v_n(x)v_m(y)$, and include various function components 515 according to the order being captured: e.g., separate functions $v_0(x)$, $v_0(y)=1$ ($0^{th}$ order variation); two separate $1^{st}$ order functions $v_1(x)$ and $v_1(y)$ ($1^{st}$ order variation); three separate functions $v_2(x)$ and $v_2(y)$ and a product $v_1(x) v_1(y)$ (2nd order variation), etc. In context of overlay control, the measured and modeled variation is comprised of vectors having an x- and y-orientation. Thus, a $0^{th}$ order variation corresponds to a translation in x and/or y directions; a $1^{st}$ order variation corresponds to rotation or magnification error; a $2^{nd}$ order will correspond to quadratic or trapezoid type error. As indicated at 520, the observed variation in the 2-D case represented as $f(x_s,y_s)$ is fitted to the generated mesh functions $w_{nm}(x,y)$ to generate new sets of 2-D coefficients $K_{nm}$. Where n+m determine the order of variation; e.g., n=1, m=0 are first order (rotation or magnification in the x or y direction).

Figure 8A:
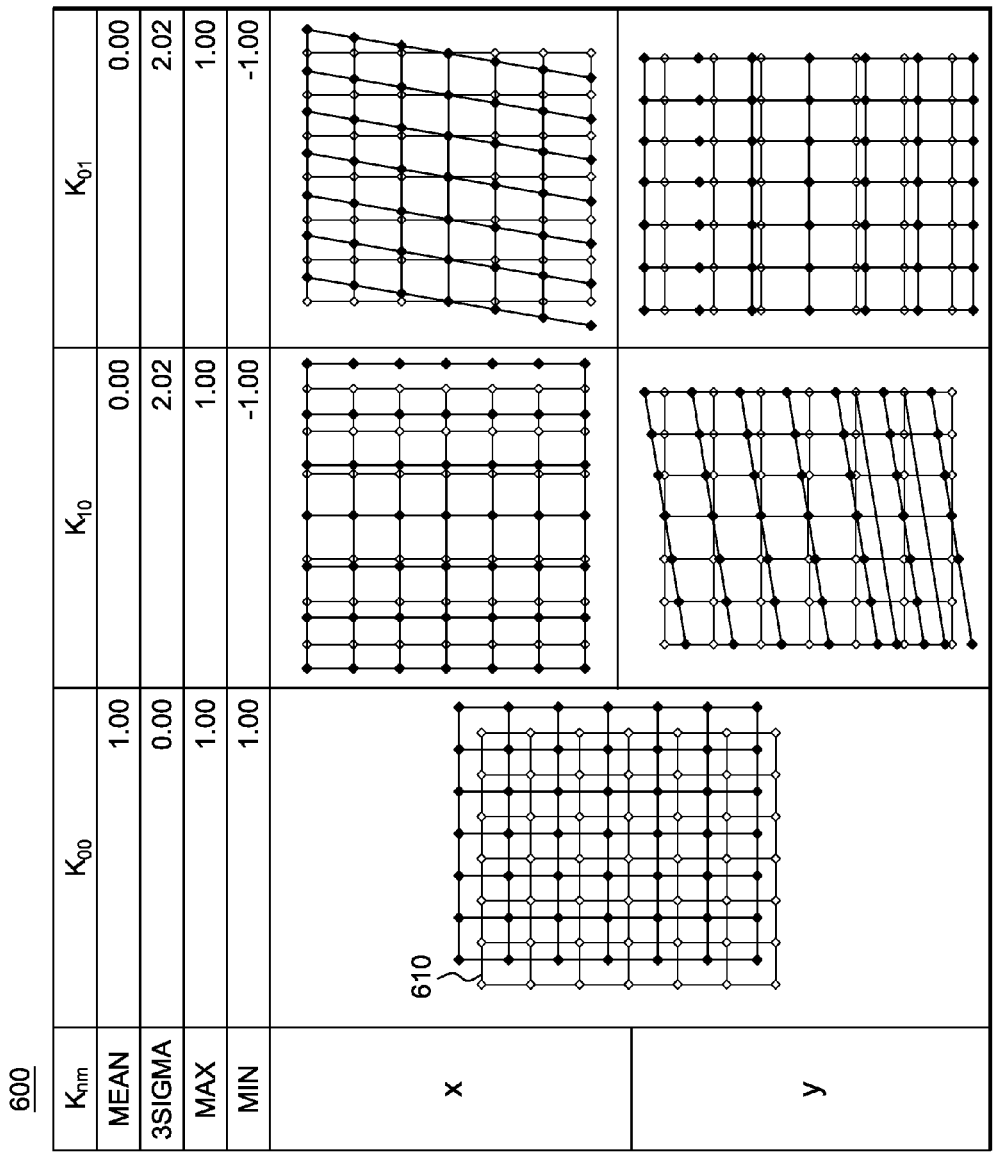
Figure 8B:
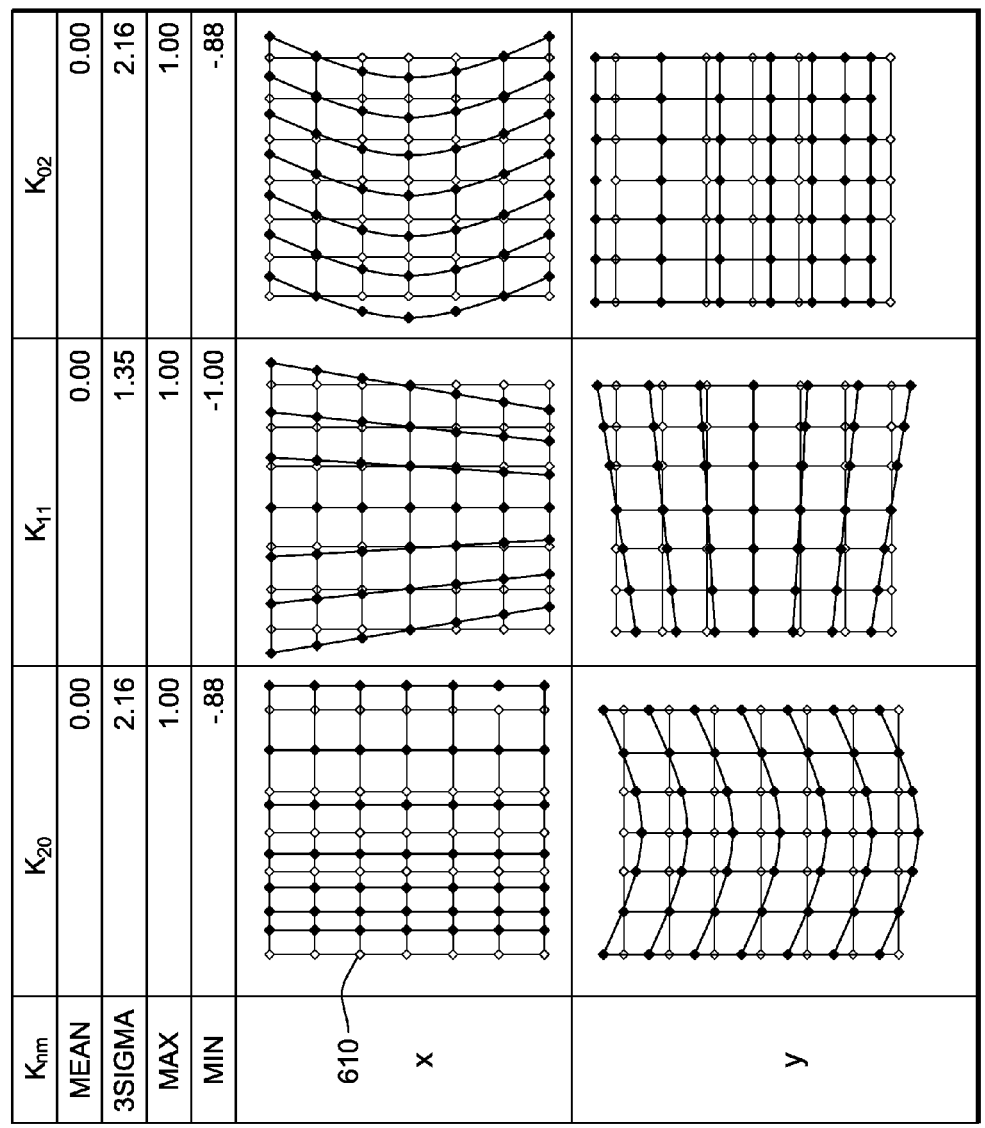
Figure 8C:
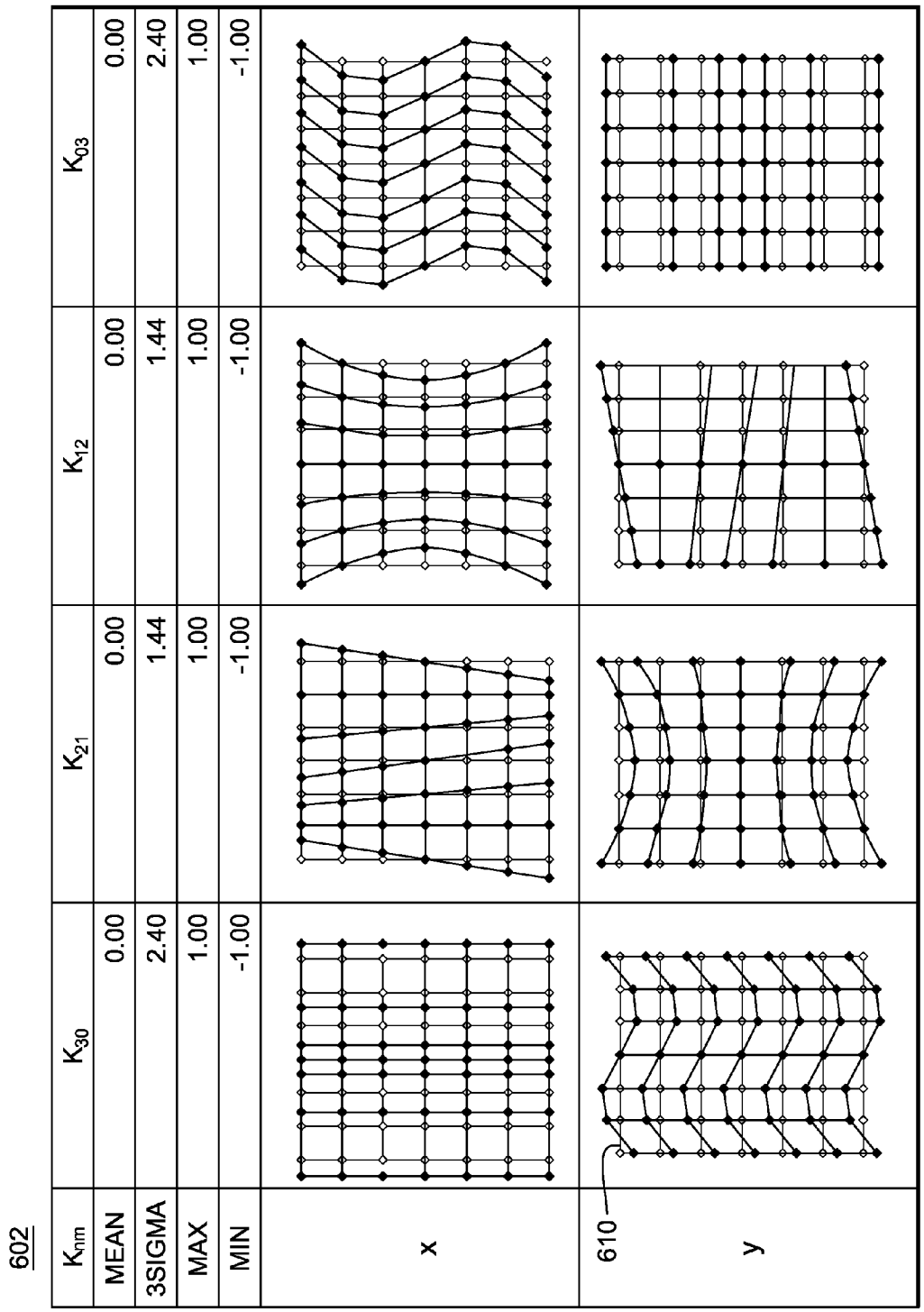
Figure 8D:
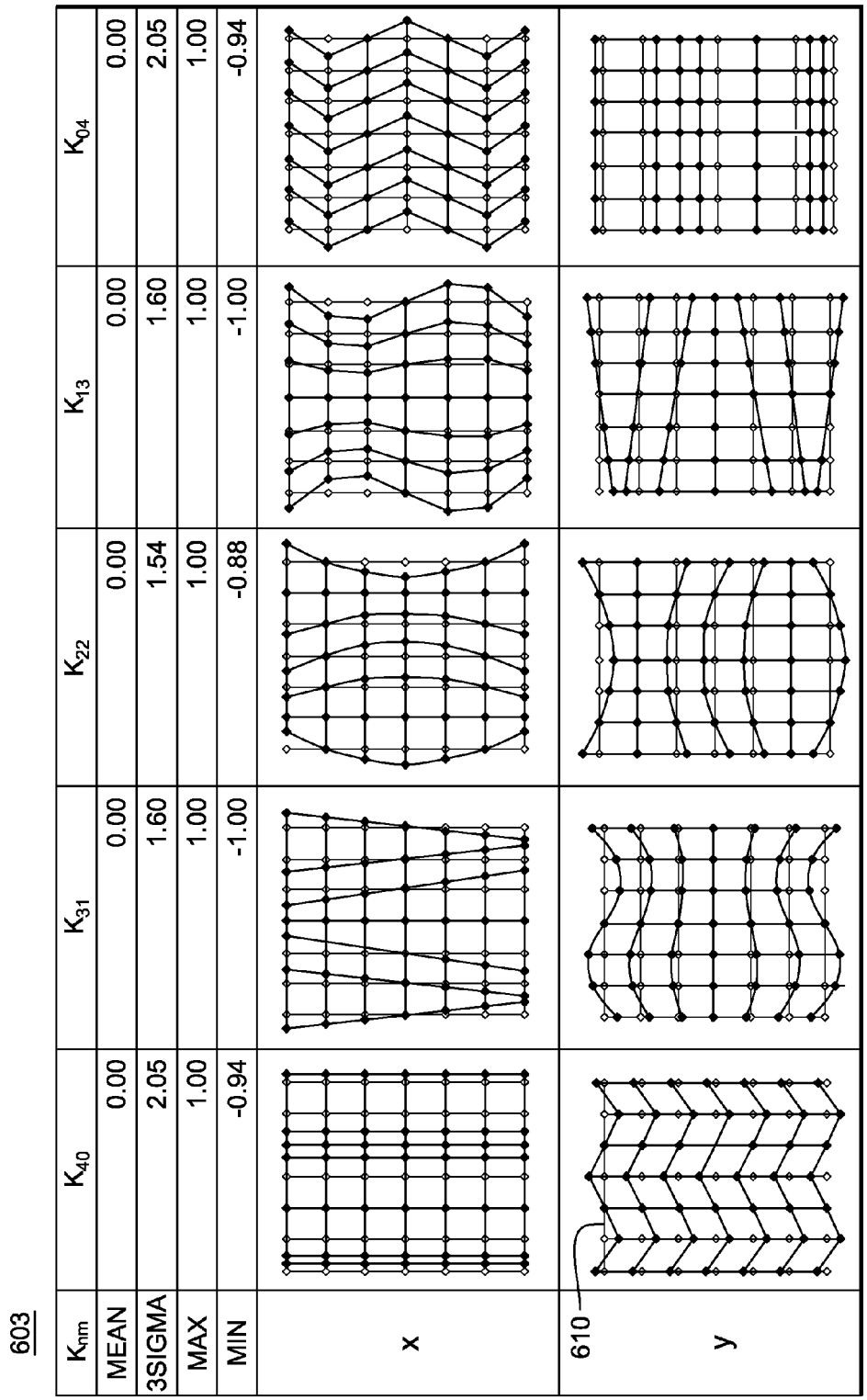

FIGS. 8A-8D show visually as overlay terms (placement terms) what each mesh function corresponds to (i.e., orthogonalized mesh functions normalized to value "1") as shown overlayed on a reference mesh, e.g., on a 7×7 mesh 610, using harmonic basis functions for capturing the example orders of variation depicted in x and y directions. In FIGS. 8A-8D, example 2-D mesh function coefficients $K_{nm}$ are the mesh function coefficients, for the constructed mesh functions corresponding to the order of variation being captured. For example, FIG. 8A shows example mesh functions 600 and various associated example statistic values (max, min, mean and 3-Sigma) associated with example coefficients $K_{00}$, $K_{10}$, $K_{01}$ for 2-D Normalized Orthogonal Function Set, e.g., 0th Order & 1st Order ($K_{nm}$=1), for the 7×7 reference mesh 610. FIG. 8B shows example mesh functions 601 and various associated statistic values (max, min, mean and 3-Sigma) associated with example coefficients $K_{20}$, $K_{11}$, $K_{02}$ for 2-D Normalized Orthogonal Function Set, e.g., $2^{nd}$ Order ($K_{nm}$=1). FIG. 8C shows example mesh functions 602 and various associated statistic values (max, min, mean and 3-Sigma) associated with example coefficients $K_{30}$, $K_{21}$, $K_{12}$, $K_{03}$ for 2-D Normalized Orthogonal Function Set, e.g., $3^{rd}$ Order ($K_{nm}$=1). FIG. 8D shows example mesh functions 603 and various associated statistic values (max, min, mean and 3-Sigma) associated with example coefficients $K_{40}$, $K_{31}$, $K_{22}$, $K_{13}$, $K_{04}$ for 2-D Normalized Orthogonal Function Set, e.g., $4^{th}$ Order ($K_{nm}$=1).

General 2-D Vector for Overlay Control System Application

The general vector case for constructing of orthogonal functions to the Field and Grid sets of domain functions on their respective selected reference meshes is now described. A general variation of both the field and grid in 2-D is simultaneously expressed as a vector $\vec{V}$ for representing variation in x and y directions. It is understood that, in this example, Field coordinates are referred to as (x,y), Grid coordinates as (X, Y), and, the observed or measured variation $\vec{V}$ at sample locations $\vec{V}(x_s,y_s; X_t,Y_t)$ where s and t are sampling points in corresponding to x and y locations. In the construction of the general model extended for Field and Grid overlay control, there is first performed selecting of Field and Grid sets of domain functions. That is, in one embodiment, the first three (3) functions constructed are the linear terms (Field: 1, x, y, ...), (Grid: 1, X, Y, ...). Higher order terms may be selected to describe anticipated nonlinear variation (minimum residuals). After generating a first set of domain functions that best characterize the non-uniformity of the patterning process, these functions are orthogonalized on the established Field and Grid domains to form corresponding Field and Grid mesh functions, $w_{nm}(x,y)$ and $W_{pq}(X,Y)$. The vector variation can then be expressed as a general expansion of the form:

$$\vec{V}(x_s, y_s; X_t, Y_t) \approx \sum_{0,0}^{N,M} \sum_{0,0}^{P,Q} \overrightarrow{C_{nmpq}} w_{nm}(x_s, y_s) W_{pq}(X_t, Y_t)$$

As shown in FIG. 9A, to minimize all residuals at once, and thereby determine all sets of coefficients at a single time, a single general expression of mesh functions 700 is constructed to model all expected variations on the mesh, and provide the ability for determining adjustments for (i.e., correcting), at once, field variations, grid variations, and coupled field and grid variations. Expression 700 includes functions of the independently generated mesh functions for the field and the grid and their products. For example, in FIG. 9A, amplitude of the products of Field mesh functions $w_{nm}(x,y)$ and Grid functions $W_{pq}(X,Y)$ are the vector coefficients $C_{nmpq}$ as shown in the expansion 700. For example, the model expression 700 may be broken apart and partially expanded 710 and evaluated as separate "F" coefficient terms pertaining to field variation 712, "G" coefficient terms pertaining to grid "field position" variation 714; and "C" coefficient terms pertaining to grid "field deformation" coefficients 716 that have specific meaning in the context of semiconductor overlay control.

FIG. 9B shows a modified sum of components expression 710' for determining values of all field $F_{nm}$ coefficients, grid $G_{pq}$ "field position" coefficients and grid "field deformation" coupled coefficients $C_{nmpq}$ at once, with n, m, p, q representing the variation order. In the broken out terms 720, FIG. 9B the expression is shown to require evaluation of terms that only include the coupled coefficient terms $C_{01pq}$ and $C_{10pq}$ as they comprise the linear field terms multiplied by the full set of grid functions W(X,Y). In the broken out terms 720 of modified expression 710' it is noted that only the linear field functions are represented (as "x" and "y" functions as the mesh functions $w_{nm}(x,y)$ are substituted with $w_{10}(x,y)$ whose value is "x", and $w_{01}(x,y)$ is replaced with value "y"); coupled terms when the field terms are non-linear are not included (i.e., anything beyond "x" and "y"). In the application of the model 700 shown in the embodiment of FIG. 9A, the general measured (observed) vector $\vec{V}(x_s,y_s; X_f,Y_t)$ is used to fit (solve for the coefficients F, G and C) and determine the components of variation for each orthogonal function, e.g., corresponding to both field, grid and, a product of field and grid functions) implemented for an overlay control system application. These F, G and C coefficients correspond to control mechanisms in the tools, i.e., respective field control, grid control and combinations of grid and field control-combinations).

In one example, calculated coefficients from the model are used to adjust Field parameters "F" controllable in a tool set. For step and scan exposure tools the Field dimensions are determined by the lens size and the extent of the reticle scan (e.g., about 25×32 mm in the wafer plane). Corrections to field pattern placement require adjustment to lens and scan parameters corresponding to the "F" coefficients for all fields on the wafer. Grid parameters "G" correctable by the tool are controlled by adjustments to the wafer stage of the scanner of the exposure tool. For example, the tool has a chuck, upon which a wafer is pre-aligned and affixed flat (e.g., by a vacuum or other means) and the exposure step includes a stage movement that positions the wafer under the lens. The lens images the reticle onto the wafer as the reticle scans over a field. The wafer stage then steps to a next location for the exposure of the next field. Thus, Grid "field position" errors "G" are corrected by adjustments to the wafer stage parameters for each field position on the wafer. Grid "field deformation" errors "C" are corrected by adjustments to the lens/scan parameters for each field position on the wafer.

Field Distortion Correction Example

FIG. 10 shows a plot of raw measurement data 800 shown as 2-D vectors 802 sampled in a Field and depict corresponding raw measured variation (in x- and y-direction) at discrete locations (samples) for which an associated mean and 3-Sigma statistic values 805 (e.g. in nanometers) are shown calculated. The raw data shown in FIG. 10 corresponds to the example measurement sample 225 shown projected onto the example 7×7 mesh 215 as shown in FIG. 4A. In the process described herein, the raw data is processed using a set of mesh functions pertaining to a Field fourth $4^{th}$ order model to perform the fit and obtain an example set of coefficients 825 which, in the example, are cut off at $4^{th}$ order for the particular data set shown. The coefficients 825 are used to correct the variation errors resulting in the residuals 832 shown in the corresponding plot 850 of FIG. 10. As shown, there is marked improvement in the corrected variation as exhibited by the computed associated mean and 3-Sigma statistic values 815. For example, there is achieved about a 70% reduction in x-direction variation and about an 80% reduction in y-direction variation. As a consequence of normalizing the mesh functions, all coefficients are in the same units (e.g., nanometers) corresponding to the maximum error in the field attributable to each coefficient. Thus, the magnitude of each coefficient denotes its relative significance. Among the computed coefficients 825 are highlighted x, y coefficients 819 having values greater than 1.0 nm, for example, to show a particular components of error of potentially influential value.

FIG. 11 shows a data table 900A of computed Field coefficients corresponding to error components for a no-mesh case, i.e., without using a reference mesh or fitting technique described herein but using only domain or basis functions; and a data table 900B of computed Field coefficients corresponding to error components computed using a 13×19 reference mesh, mesh functions and fitting technique as described herein. The data tables 900A,B depict those coefficients corresponding to correctable error components for which the tool set has adjustment controls or "knobs" to correct. There is further depicted data tables 950A,B that correspond to grids 900A,B, respectively: with data grid 950A indicating resulting computed Field coefficients corresponding to error components computed using only domain functions (no-mesh); and, a data grid 950B indicating resulting computed Field coefficients corresponding to error components computed using a 13×19 reference mesh and fitting technique as described herein. However, model coefficients grids 950A,B show highlighted Field coefficient values 925 corresponding to uncorrectable parameters in which a tool set may not have knobs to correct. In both cases 900A,B (no-mesh, mesh and correctable components) and 950A,B (no-mesh, mesh and un-correctable components) there is shown improvement in the reduction of variation in the x-direction as exhibited by differences between Raw 3-sigma value and Residual 3-sigma values which show improvement in each of grids 900A, 900B and 950A, 950B. More particularly, in each grid 900A, 900B there is shown no discernable change in the amount of variation correction in the x-direction (for the no-mesh case and mesh cases). However, in the grids 950A, 950B where some components have not been corrected, there is more variation correction in the x-direction in the mesh case (e.g., −42%) as compared with the no-mesh case (e.g., −29%). If corrections are not applied, then in the no-mesh case showing coefficients 950A in the y-direction, there is depicted a degradation in the error as shown by a 5% at increase in residual error at 975 (% increase difference between Raw 3-sigma value and Residual 3-sigma values). In the example using the defined 13×19 mesh, and corrections not applied there is still shown in the example data slight improvement in the error correction capability (for the example tool set) as exemplified by a net % decrease in difference between Raw 3-sigma value and Residual 3-sigma values) in both x and y directions. During implementation of the method, it is desirable to determine all coefficients to provide indication as to what is influential and possibly apply corrections to parameters corresponding to some of the parameters, e.g., corresponding to coefficients for which corrections can be applied, or, corresponding to those whose calculated change in that coefficient was insignificant.

In the example embodiment of FIG. 2B, in the context of nonlinear overlay control, the implementation of the modeling at 125' attempts to minimize overlay and patterning alignment errors given the tool set. For example, the modeling performed generates coefficients of the constructed orthogonal functions that correspond to either correctable or non-correctable product attributes. For example, in a given tool or process there is a limited knobs are available for controlling the process to minimize the errors. However, the adjustable control parameters (e.g., knobs to a processing tool that can control a processing parameter) may but do not all necessarily correlate 1:1 with a coefficient to be solved for the mesh functions of the particular model implemented. That is, in some cases, there may be no adjustable control parameter knob that corresponds to a determined coefficient of the mesh functions model (e.g., that can be fed back to a processing tool); alternately, a control knob may represent some combination of coefficients and may change from tool set to tool set. The system and method enables the robust mapping possible as it identifies both correctable and uncorrectable coefficients of formed mesh functions. For example, a dynamically correctable coefficient output value of the modeled variation may be directly fed back to a particular control knob to fix an error, or, the coefficients may be used to flag an intervention, e.g., to stop a tool and conduct a calibration procedure; or, these coefficients may be monitored to ascertain whether their value may have varied over time above or below a specified amount which may dictate a course of action.

Thus, with respect to FIG. 2B, the method 100' provides for transforming measured error to tool/process (corrections and diagnostics) by expanding functions that characterize sampled variation, and quantifying correctable/uncorrectable components of variation. As described, the computed coefficients corresponding to correctable/uncorrectable components correspond to: system constants (methodology used to set system constants to minimize the variation during calibration); coefficients that are used when running monitor wafers to obtain measurements for correcting correct baseline operation of the tool (incremental corrections on top of system constants) which baseline corrections can be performed each time a monitor is run; and, further, during real-time production, the coefficients as computed herein are used during real product manufacture for making run-time corrections (specific product to specific tool at one time). In this scenario, a sparser sampling scheme may be used.

FIG. 12 illustrates an exemplary hardware configuration of a computing system 1000 running and/or implementing the methods described herein, e.g., in a semiconductor manufacturing facility. The hardware configuration preferably has at least one processor or central processing unit (CPU) 1011. The CPUs 1011 are interconnected via a system bus 1012 to a random access memory (RAM) 1014, read-only memory (ROM) 1016, input/output (I/O) adapter 1018 (for connecting peripheral devices such as disk units 1021 and tape drives 1040 to the bus 1012), user interface adapter 1022 (for connecting a keyboard 1024, mouse 1026, speaker 1028, microphone 1032, and/or other user interface device to the bus 1012), a communication adapter 1034 for connecting the system 1000 to a data processing network, the Internet, an Intranet, a local area network (LAN), etc., and a display adapter 1036 for connecting the bus 1012 to a display device 1038 and/or printer 1039 (e.g., a digital printer of the like).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with a system, apparatus, or device running an instruction.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with a system, apparatus, or device running an instruction. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may run entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which run via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which run on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more operable instructions for implementing the specified logical function(s). It should also be noted that, in some alternative implementations, the functions noted in the block may occur out of the order noted in the figures. For example, two blocks shown in succession may, in fact, be run substantially concurrently, or the blocks may sometimes be run in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While there has been shown and described what is considered to be preferred embodiments of the invention, it will, of course, be understood that various modifications and changes in form or detail could readily be made without departing from the spirit of the invention. It is therefore intended that the scope of the invention not be limited to the exact forms described and illustrated, but should be construed to cover all modifications that may fall within the scope of the appended claims.

Having thus described our invention, what we claim as new, and desire to secure by Letters Patent is:

1. A method for performing a real-time control of a semiconductor product manufacturing process, the method comprising:
   measuring attributes of a spatial feature being patterned over an area of a semiconductor product being manufactured by one or more semiconductor manufacturing tools, the measured attributes including: a non-linear spatial variation of the feature of the semiconductor product;
   generating one or more orthogonal and normalized mesh functions which model the non-linear spatial variation of the feature on the semiconductor product being manufactured;
   determining coefficients of the one or more generated orthogonal and normalized mesh functions in real-time for particular non-spatial variations;
   mapping the determined coefficients to actual process parameters that govern the semiconductor product manufacturing process;
   adjusting, based on the determined coefficients, the one or more semiconductor manufacturing tools during manufacturing the semiconductor product; and
   correcting, by the semiconductor manufacturing tool adjustment, the non-linear spatial variation on the feature of the semiconductor product being manufactured,
   wherein a processor coupled to a memory device is configured to perform: the measuring, the generating, the determining, the adjusting, the mapping and the correcting.

2. The method according to claim 1, wherein the correcting the non-linear spatial variation includes:
   adjusting the determined coefficients;
   minimizing, based on the adjusting the determined coefficients, the non-linear spatial variation on discrete locations of the semiconductor product feature being manufactured;
   improving, by the minimizing the non-linear spatial variation, a boundary condition behavior of the semiconductor product being manufactured, the boundary condition including one or more of: a field edge of the semiconductor product having the feature, a wafer edge of the semiconductor product having the feature.

3. The method according to claim 2, wherein the determined coefficients include:
   a first coefficient that pertains to a field variation of the semiconductor product feature being manufactured, the first coefficient applicable for real-time adjusting of one or more semiconductor manufacturing tools associated with a lens scanning operation among the one or more semiconductor manufacturing tools;
   a second coefficient that pertains to a grid variation of the semiconductor product feature being manufactured, the second coefficient applicable for real-time adjusting of a scanning step of an exposure tool among the one or more semiconductor manufacturing tools; and
   a third coefficient that pertains to a grid field deformation used for an overlay control of the semiconductor product feature being manufactured, the third coefficient applicable to an adjustment of the one or more semiconductor manufacturing tools associated with a lens scanning operation of the one or more semiconductor manufacturing tools.

4. The method according to claim 3, wherein the mesh functions represent one or more non-linear spatial variations in pattern attributes over discrete locations of the semiconductor product being manufactured.

5. The method according to claim 1, wherein the semiconductor manufacturing tool adjustment comprises:
   reducing a coupling between the determined coefficients.

6. The method according to claim 3, wherein the determining the coefficients comprises:
   fitting the one or more orthogonal and normalized mesh functions to the pattern attributes over the discrete locations of the semiconductor product being manufactured.

7. The method according to claim 1, wherein a summation of a multiplication of two different orthogonal and normalized mesh functions within a domain results in zero.

8. The method according to claim 1, wherein the measuring the attributes comprises:
   representing the non-linear spatial variation as a vector that represents the non-linear spatial variation of the semiconductor product feature in 2 dimensions (x and y directions).

9. The method according to claim 1, wherein the orthogonal and normalized mesh functions characterize non-uniformity of a patterning process over the semiconductor being manufactured and are orthogonalized over field and grid domains in order to form field and grid mesh functions.

10. An apparatus for performing a real-time control of a semiconductor product manufacturing process, the method comprising:
    a memory device;
    a processor coupled to the memory device, wherein the processor is configured to perform:
       measuring attributes of a spatial feature being patterned over an area of a semiconductor product being manufactured by one or more semiconductor manufacturing tools, the measured attributes including: a non-linear spatial variation of the feature of the semiconductor product;

generating one or more orthogonal and normalized mesh functions which model the non-linear spatial variation of the feature on the semiconductor product being manufactured;

determining coefficients of the one or more generated orthogonal and normalized mesh functions in real-time for particular non-spatial variations;

adjusting, based on the determined coefficients, the one or more semiconductor manufacturing tools during manufacturing the semiconductor product;

mapping the determined coefficients to actual process parameters that govern the semiconductor product manufacturing process; and correcting, by the performed semiconductor manufacturing tool adjustment, the non-linear spatial variation on the feature of the semiconductor product being manufactured.

11. The system according to claim 10, wherein in order to perform the correcting the non-linear spatial variation, the processor is further configured to perform:

adjusting the determined coefficients;

minimizing, based on the adjusting the determined coefficients, the non-linear spatial variation on discrete locations of the semiconductor product feature being manufactured;

improving, by the minimizing the non-linear spatial variation, a boundary condition behavior of the semiconductor product being manufactured, the boundary condition including one or more of: a field edge of the semiconductor product having the feature, a wafer edge of the semiconductor product having the feature.

12. The system according to claim 11, wherein the determined coefficients include:

a first coefficient that pertains to a field variation of the semiconductor product feature being manufactured, the first coefficient applicable for real-time adjusting of one or more semiconductor manufacturing tools associated with a lens scanning operation among the one or more semiconductor manufacturing tools;

a second coefficient that pertains to a grid variation of the semiconductor product feature, the second coefficient applicable for real-time adjusting of a scanning step of an exposure tool among the one or more semiconductor manufacturing tools; and a third coefficient that pertains to a grid field deformation used for an overlay control of the semiconductor product feature being manufactured, the third coefficient applicable to an adjustment of the one or more semiconductor manufacturing tools associated with the lens scanning operation among the one or more semiconductor manufacturing tools.

13. The system according to claim 12, wherein the mesh functions represent one or more non-linear spatial variations in pattern attributes over discrete locations of the semiconductor product being manufactured.

14. The system according to claim 10, wherein the adjusting the semiconductor manufacturing tool comprises:

reducing a coupling between the determined coefficients.

15. The system according to claim 14, wherein in order to perform the determining the coefficients, the processor is further configured to perform:

fitting the one or more orthogonal and normalized mesh functions to the pattern attributes over the discrete locations of the semiconductor product being manufactured.

16. The system according to claim 10, wherein a summation of a multiplication of two different orthogonal and normalized mesh functions within a domain results in zero.

17. The system according to claim 10, wherein in order to perform the measuring the attributes, the processor is further configured to perform:

representing the non-linear spatial variation as a vector that represents the non-linear spatial variation of the feature in 2 dimensions (x and y directions).

18. The system according to claim 10, wherein the orthogonal and normalized mesh functions characterize non-uniformity of a patterning process over the semiconductor product being manufactured and are orthogonalized over field and grid domains in order to form field and grid mesh functions.

19. A computer program product for performing a real-time control of a semiconductor product manufacturing process, the computer program device comprising a non-transitory storage medium readable by a processing circuit and storing instructions run by the processing circuit for performing a method, the method comprising:

measuring attributes of a spatial feature being patterned over an area of a semiconductor product being manufactured by one or more semiconductor manufacturing tools, the measured attributes including: a non-linear spatial variation of the feature of the semiconductor product;

generating one or more orthogonal and normalized mesh functions which model the non-linear spatial variation of the feature on the semiconductor product being manufactured;

determining coefficients of the one or more generated orthogonal and normalized mesh functions in real-time for particular non-spatial variations;

adjusting, based on the determined coefficients, the one or more semiconductor manufacturing tools during manufacturing the semiconductor product;

mapping the determined coefficients to actual process parameters that govern the semiconductor product manufacturing process; and correcting, by the performed semiconductor manufacturing tool adjustment, the non-linear spatial variation on the feature of the semiconductor product being manufactured.

20. The computer program product according to claim 19, wherein the correcting the non-linear spatial variation includes:

adjusting the determined coefficients;

minimizing, based on the adjusting the determined coefficients, the non-linear spatial variation on discrete locations of the semiconductor product feature being manufactured;

improving, by the minimizing the non-linear spatial variation, a boundary condition behavior of the semiconductor product being manufactured, the boundary condition including one or more of: a field edge of the semiconductor product having the feature, a wafer edge of the semiconductor product having the feature.

21. The computer program product according to claim 20, wherein the determined coefficients include:

a first coefficient that pertains to a field variation of the semiconductor product feature being manufactured, the first coefficient applicable for real-time adjusting of one or more semiconductor manufacturing tools associated with a lens scanning operation among the one or more semiconductor manufacturing tools;

a second coefficient that pertains to a grid variation of the semiconductor product feature, the second coefficient applicable for real-time adjusting of a scanning step of an exposure tool among the one or more semiconductor manufacturing tools; and a third coefficient that pertains to a grid field deformation used for an overlay control of the semiconductor product feature being manufactured, the third coefficient applicable to an adjustment of the one or more semiconductor manufacturing tools associated with the lens scanning operation among the one or more semiconductor manufacturing tools.

22. The computer program product according to claim 21, wherein the mesh functions represent one or more non-linear spatial variations in pattern attributes over discrete locations of the semiconductor product being manufactured.

23. The computer program product according to claim 19, wherein the performing the semiconductor manufacturing tool adjust comprises:
reducing a coupling between the determined coefficients.

* * * * *